(12) United States Patent
Kuribayashi et al.

(10) Patent No.: US 6,938,335 B2
(45) Date of Patent: Sep. 6, 2005

(54) ELECTRONIC COMPONENT MOUNTING METHOD

(75) Inventors: Takeshi Kuribayashi, Yamanashi (JP); Kazuyuki Nakano, Yamanashi (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 330 days.

(21) Appl. No.: 10/153,673

(22) Filed: May 24, 2002

(65) Prior Publication Data

US 2002/0194729 A1 Dec. 26, 2002

Related U.S. Application Data

(63) Continuation-in-part of application No. 09/319,779, filed on Jun. 11, 1999, now Pat. No. 6,429,387.

(30) Foreign Application Priority Data

Dec. 13, 1996 (JP) .............................. 8-333782

(51) Int. Cl.[7] .............................................. H05K 3/30
(52) U.S. Cl. ............................. 29/834; 29/832; 29/833; 29/836; 29/720; 29/744; 257/777; 257/786; 382/151
(58) Field of Search ................... 29/464–468, 720–721, 29/744, 830–836, 842, 846, 740; 174/52.2, 52.3, 52.4, 260, 261; 257/777, 786, 797; 361/767, 768, 777, 782, 783, 787, 808, 811; 382/145, 151; 438/16, 108

(56) References Cited

U.S. PATENT DOCUMENTS

| 4,731,923 A | 3/1988 | Yagi et al. ..................... 29/833 |
| 4,896,034 A | 1/1990 | Kiriseko ..................... 250/271 |
| 5,172,468 A | * 12/1992 | Tanaka et al. ................. 29/833 |
| 5,297,333 A | * 3/1994 | Kusaka ......................... 29/840 |
| 5,381,307 A | 1/1995 | Hertz et al. ................. 361/767 |
| 5,414,519 A | 5/1995 | Han |
| 5,512,712 A | 4/1996 | Iwata et al. .................. 174/258 |
| 5,644,102 A | 7/1997 | Rostoker .................... 174/52.1 |
| 5,726,502 A | 3/1998 | Beddingfield ............... 257/797 |
| 5,805,421 A | 9/1998 | Livengood et al. ......... 361/736 |
| 5,822,191 A | 10/1998 | Tagusa et al. .............. 361/751 |
| 6,168,971 B1 | * 1/2001 | Love et al. ................. 438/108 |
| 6,195,454 B1 | 2/2001 | Yazawa |
| 6,476,499 B1 | * 11/2002 | Hikita et al. ................ 257/777 |
| 6,593,168 B1 | * 7/2003 | Ehrichs et al. ............. 438/108 |

FOREIGN PATENT DOCUMENTS

| JP | 1-157433 | 10/1989 |
| JP | 4-40538 | 4/1992 |
| JP | 4-370995 | 12/1992 |
| JP | 5-267803 | 10/1993 |
| JP | 6-288732 | 10/1994 |
| JP | 7-142634 | 6/1995 |
| JP | 7-303000 | 11/1995 |
| JP | 8-293671 | 11/1996 |

OTHER PUBLICATIONS

Burr–Brown, *Integrated Circuits Data Book Supplement*, vol. 33C, 1992, p. 6.1.39.

* cited by examiner

*Primary Examiner*—Minh Trinh
*Assistant Examiner*—Donghai D. Nguyen
(74) *Attorney, Agent, or Firm*—Wenderoth, Lind & Ponack, L.L.P.

(57) ABSTRACT

A component mounting method recognizes reference marks on a printed circuit board and an electronic component, and uses these reference marks to determine a shift between a position of the circuit board and a position of the electronic component. This shift is corrected and then the electronic component is mounted to the printed circuit board such that electrical connecting portions of the circuit board are connected to electrical connecting portions of the electronic component. The reference marks are formed simultaneously with corresponding electrical connecting portions via a mask, such that in order to accurately position the electrical connecting portions, it is only necessary to accurately relatively position the reference marks.

20 Claims, 22 Drawing Sheets

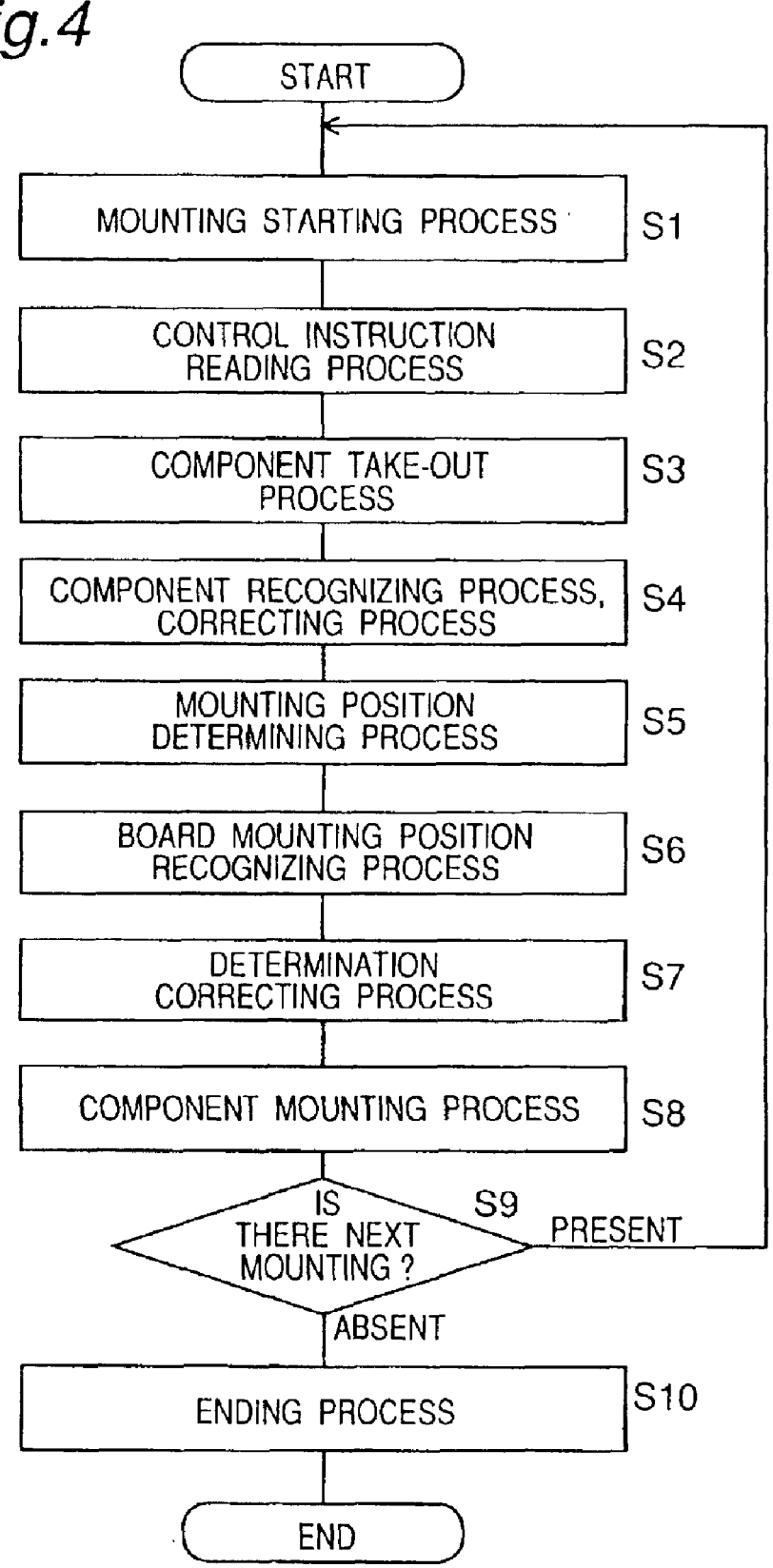

*Fig.5A*          *Fig.5B*
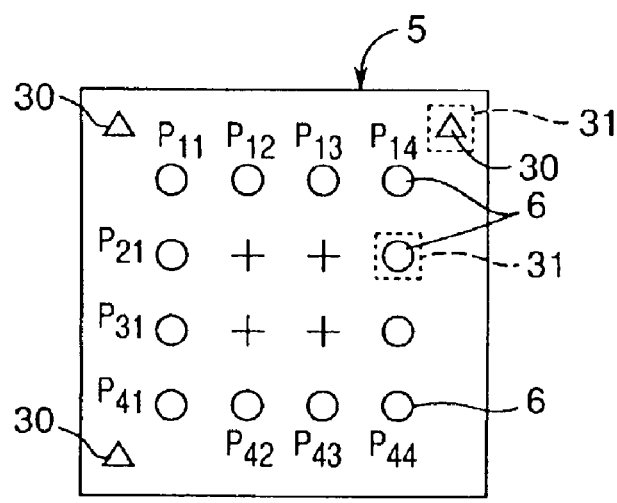
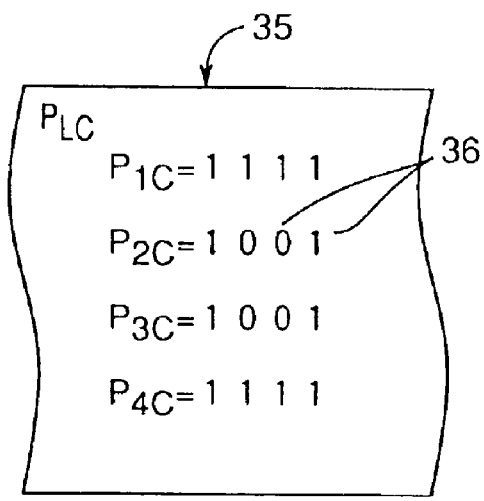
○ ··· 201 IS PRESENT             1 ··· PRESENT
+ ··· 201 IS ABSENT              0 ··· ABSENT

ELECTRONIC COMPONENT MOUNTING METHOD

This application is a Continuation-in-Part of application Ser. No. 09/319,779, filed Jun. 11, 1999 now U.S. Pat. No. 6,429,387.

BACKGROUND OF THE INVENTION

1. Technical Field

The present invention relates to an electronic component having electrical connecting portions such as solder bumps or electrodes (lands, for example) exemplified by a solder bump component of a BGA (Ball Grid Array) type semiconductor component package (referred to as a BGA component hereinafter) represented by a CSP (Chip Size Package) or an electronic component such as QFP in forming an electronic circuit and relates to the mounting method and apparatus thereof.

2. Description of Related Art

In recent years, personal computers, portable telephones, information communications devices, multimedia electronic equipment, and the like have been compacted and provided with improved functions. Further, the electronic components and printed boards constituting electronic circuits have been made to have higher densities and finer constructions due to higher frequencies, and the mounting of components having a plurality of pins go mainstream in conformity to high-density circuits of QFP (Quad Flat Package) and the like. However, on increasing the density, the lead pitch of the connecting portions has been reduced in stages, for example, from 0.5 mm through 0.3 mm to the extent of 0.2 mm, for which the mounting method and manufacturing method themselves have become hard to be achieved.

It is further demanded for electronic circuits to cope with the reduction in size, higher functions, and higher frequencies, and this leads to a great desire to effectively mount printed boards with electronic components having solder bumps such as BGA (Ball Grid Array) represented by bare ICs of narrower lead pitches and CSP (Chip Size Package) and the like.

FIG. 15 is a front view schematically showing the land patterns of a QFP component and BGA components having solder bumps on a printed board. FIG. 16A is a sectional view of the BGA component having these solder bumps and the printed board to be mounted with the BGA component, while FIG. 16B is a bottom view of the BGA component. In FIG. 15 and FIGS. 16A and 16B, reference numeral 1 denotes a printed board, 2 BGA component connecting lands, 2' QFP connecting lands, 3 BGA component use board recognition marks, 3' QFP use board recognition marks, 4 BGA component land patterns, 4' a QFP land pattern, 5 a BGA component that serves as an electronic component, 6 a bump-shaped solder connecting portions (referred to as BG connecting portions hereinafter) that serves as portions to be electrically connected via solder bumps 7 to the circuit board electrodes, and 7 the solder bumps.

There is further known a component mounting apparatus as shown in the partially see-through perspective view of FIG. 17 as a principal implement of a mounting position determining method of the component mounting apparatus. In FIG. 17, reference numeral 10 denotes a component mounting apparatus, 11 an operating section, 12 a control section, 13 a mounting head, 14 a mounting table, 15 a conveyance rail, and 16 a component supplying section. The component mounting apparatus 10 shown in FIG. 17 is mounted with the sliding component supplying section 16 and an X-Y table that serves as the mounting table 14 for holding and positioning a printed board.

FIG. 18 is a partially see-through perspective view of another component mounting apparatus. In FIG. 18, reference numeral 10 denotes a component mounting apparatus, 11 an operating section for executing inputting and outputting for the execution of a mounting program of NC data or the like, 12 a control section for controlling the whole mounting process by recognition, calculation, and various instructions in mounting components, 13 a mounting head for holding the component to be mounted and mounting the component on the board, 13a a component inspecting section for inspecting the component held by the mounting head, 13b a board recognizing section for recognizing the position of the board conveyed to the board mounting table, 14 a mounting table for holding the board that is conveyed so as to be mounted with the component, 15 a conveyance rail for conveying the board with respect to the mounting table 14, 16 a component supplying section for supplying the component to be mounted, 16' a parts tray that serves as an example of the component supplying section 16 in which components are arranged in a matrix form, 16a a parts cassette that serves as an example of the component supplying section 16 in which tape components are stored, 16b a bulk cassette that serves as an example of the component supplying section 16 in which components are stored, and 16c a parts tray storing section for storing the parts tray 16'. As shown in FIG. 18, there is known the mounting apparatus having the above construction, which operates to pick up an electronic component from the component supplying section 16 by the mounting head 13 and move the electronic component held by the mounting head 13 to the mounting table 14 while recognizing the posture and so on of the electronic component held by the mounting head 13, thereafter moving the electronic component by the mounting head 13 to the mounting position on the board 1 held on the mounting table 14 and subsequently lowering the mounting head 13 to execute the mounting of the electronic component in the mounting position of the board 18. It is to be noted that the BGA components are generally stored in the parts tray 16' or the parts cassette 16a. The components can be mounted in and supplied from the tape-shaped parts cassette 16a, the bulk cassette 16b for components stored in a scattered form, the component supply section 16' that concurrently serves as a plate-shaped parts tray, and the like, which serve as a removable component set for continuously supplying the components. Further, the printed board 1 is conveyed onto the mounting table 14 for mounting the components, by the conveyance rails 15, and subjected to a specified mounting process, and thereafter the printed board 1 is conveyed to the outside by the conveyance rails 15.

Further, FIG. 19 shows a sectional view showing the mounting of a BGA component by the component mounting apparatus shown in FIG. 18. Solder paste 7' is provided on the connection lands 2 of the printed board 1 shown in FIG. 16A, and the BGA component 5 supplied from the component supplying section 16 is held by the mounting head 13 and moved to a specified position of the printed board 1. Thereafter, as shown in FIG. 19, the BGA component 5 held by the mounting head 13 is depressed in the direction of the arrow D so as to connect the solder bumps 7 of the BG connecting portions 6 to the connection lands 2 of the printed board 1 via the solder paste 7' provided on the lands 2.

The operation of the prior art electronic component mounting apparatus will be described with reference to FIG. 16. This component mounting apparatus 10 is to mount an electronic component (BGA component 5) on the printed board 1. On the component supplying section 16 or 16' is provided a cassette or a tray conforming to the type of the electronic component necessary for actual mounting by the component mounting apparatus 10. Each cassette or tray supplies a component that is needed every moment.

The component necessary for the mounting is taken out by the mounting head 13, and the electronic component is subjected to component recognition executed by the component inspecting section 13*a* and to quality check (good-or-bad decision) and retention posture check of the component by comparing the result of recognition with the shape preparatorily stored in the control section. On the basis of the result of this check, posture correction data of the component is stored in the control section in a correction process as needed, and then, the target mounting land position on the printed board 1 is recognized by the board recognizing section 13*b*. Thereafter, the electronic component held by the mounting head is positioned in the recognized mounting land position, and the electronic component is mounted on the board with a certain accuracy after executing posture correction based on the posture correction data and board position dislocation data previously stored in the control station.

In mounting the BGA component 5 having the solder bumps 7, which is an electronic component as shown in FIGS. 16A and 16B, between the connection lands 2 on the printed board 1 and the BG connecting portions 6 of the connecting surface of the BGA component 5 cannot generally be checked for the confirmation of the component being mounted within a proper range since it is hidden behind the BGA component 5 in appearance after the component is mounted.

Therefore, according to the prior art mounting method or the mounting apparatus, as an example of the electronic component position detecting method for securing the mounting position and the soldering quality in mounting the BG connecting portions 6 on the board, the mounting is executed by detecting the position of the component based on the contour of the whole component through image recognition as disclosed in the Japanese Laid-Open Patent Publication No. 6-288732 or based on the state of the partial or total arrangement of the BG connecting portions 6 and the connecting surface.

However, according to the mounting method and apparatus of the component having solder bumps constructed as above, the actual positions of the BG connecting portions become uncertain in the case of only the contour, or much time is required in executing the positional detection of the BG connecting portions one by one. As a result, the time of recognition required for the positional detection of the BG connecting portions themselves influences the time of the mounting cycle. Therefore, the positional detection has been partially executed instead of executing the positional detection of all the BG connecting portions, meaning that the processing has been executed without correct positional detection.

With regard to the arrangement pattern of the BG connecting portions in the connecting surface of the BGA component, a variety of patterns based on the matrix pattern as shown in FIG. 20A including variations such as a pattern in which the BG connecting portions are partially not existing, as shown in FIG. 20B through FIG. 20J, must be recognized. Since such a variety of patterns are requested to be recognized, the partial positional detection of the BG connecting portions solely becomes incorrect. The state of partial or whole arrangement of the BG connecting portions is subjected to a recognition process such that the contour is set in the position detecting process since no definite reference point for executing image processing exists.

Furthermore, in order to recognize and check the correct position and pattern, a greater processing storage capacity, a complicated algorithm, and so on for the check are needed to consume much processing time, and the time required for the processing exerts a great influence on the time of the mounting cycle. Particularly in the case of the BGA components having irregular patterns as shown in FIGS. 20H through 20J, more complicated processing and memory resources are required, and this has led to the problem that the positional detection and the arrangement pattern recognition are practically difficult.

The present invention solves the aforementioned prior art problems and has the object of providing an electronic component as well as mounting method and apparatus of the component that are able to recognize the state of arrangement of the whole electrical connecting portions easily and correctly at high speed in mounting the electronic components such as: a BGA component represented by, for example, CSP having solder bumps for forming an electronic circuit; or a QFP component having no solder bump for forming an electronic circuit and satisfies a reliable component mounting quality of a high productivity.

SUMMARY OF THE INVENTION

The present invention is constructed as follows to achieve the aforementioned object.

According to a first aspect of the present invention, there is provided an electronic component to be mounted on a printed board, characterized by comprising:

a plurality of electrical connecting portions provided on an electrical connecting surface of the electronic component and the printed board; and a reference mark that serves as a reference of arrangement positions of the electrical connecting portions.

According to a second aspect of the present invention, there is provided an electronic component according to the first aspect, characterized in that the reference mark of the electronic component is provided on the electrical connecting surface side facing a mounting position on the printed board.

According to a third aspect of the present invention, there is provided an electronic component according to the first aspect, characterized in that the reference mark of the electronic component is provided on the opposite side of the electrical connecting surface that faces the mounting position on the printed board.

According to a fourth aspect of the present invention, there is provided an electronic component according to the second or third aspect, characterized in that the reference mark of the electronic component is a projection peculiar to the electronic component, or a print.

According to a fifth aspect of the present invention, there is provided an electronic component according to the second or third aspect, characterized in that the reference mark of the electronic component includes at least one reference mark obtained by coding information concerned with the electronic component.

According to a sixth aspect of the present invention, there is provided an electronic component according to the fifth aspect, characterized in that the information of the reference mark is discrimination information of the electronic component expressed by a two-dimensional bar code.

According to a seventh aspect of the present invention, there is provided an electronic component according to the fifth aspect, characterized in that the information of the reference mark is information concerned with a state in which the electrical connecting portions are formed.

According to an eighth aspect of the present invention, there is provided an electronic component according to any one of the first through seventh aspects, wherein the reference mark is located in a corner portion of the electronic component.

According to a ninth aspect of the present invention, there is provided an electronic component according to any one of the first through eighth aspects, the reference mark is formed on the electronic component simultaneously with the electrical connecting portions.

According to a tenth aspect of the present invention, there is provided an electronic component according to any one of the first through ninth aspects, wherein the electrical connecting portions are solder bumps.

According to an eleventh aspect of the present invention, there is provided an electronic component according to any one of the first through ninth aspects, wherein the electrical connecting portions are lands.

According to a twelfth aspect of the present invention, there is provided an electronic component mounting method for taking out an electronic component from a component supply section and mounting the electronic component in a mounting position on a printed board, comprising:

a recognizing process for recognizing a reference mark that is provided on the electronic component to be mounted and serves as a reference of arrangement positions of electrical connecting portions provided on an electrical connecting surface of the electronic component and the printed board; and a quality checking or correcting process for executing quality check of the electronic component or executing positional correction in a mounting stage according to a result of recognition, whereby the mounting of the electronic component that has passed through the quality checking or correcting process is executed.

According to a thirteenth aspect of the present invention, there is provided an electronic component mounting method for taking out an electronic component from a component supply section and mounting the electronic component in a mounting position on a printed board, comprising:

a first recognizing process for recognizing a reference mark that is provided on the electronic component to be mounted and serves as a reference of arrangement positions of electrical connecting portions provided on an electrical connecting surface of the electronic component and the printed board;

a second recognizing process for recognizing a recognition mark of a target mounting position on the printed board; and a quality checking and correcting process for executing quality check of the electronic component and executing positional correction in a mounting stage according to results of recognition of the first recognizing process and the second recognizing process, whereby the mounting of the electronic component that has passed through the quality checking and correcting process is executed.

According to a fourteenth aspect of the present invention, there is provided an electronic component mounting method according to the twelfth or thirteenth aspect, characterized in that the quality check of the electronic component to be mounted includes a component inspecting process for checking the electronic component by a state of formation of the electrical connecting portions recognized based on a relative position with respect to the reference mark of the electronic component.

According to a fifteenth aspect of the present invention, there is provided an electronic component mounting method according to any one of the twelfth through fourteenth aspects, characterized in that at least one of a plurality of recognition marks of the target mounting position on the printed board is discrimination information of the electronic component to be mounted, the information being expressed by a two-dimensional bar code obtained by coding information.

According to a sixteenth aspect of the present invention, there is provided an electronic component mounting method according to any one of the twelfth through fifteenth aspects, wherein the reference mark of the electronic component includes at least one reference mark obtained by coding information concerned with the state of formation of the electrical connecting portions, and the electronic component that is determined to be defective through the quality checking process is processed on the basis of the information of the reference mark concerned with the state of formation of the electrical connecting portions.

According to a seventeenth aspect of the present invention, there is provided an electronic component mounting method according to any one of the twelfth through fourteenth aspects, wherein the reference mark is formed on the electronic component simultaneously with the electrical connecting portions.

According to an eighteenth aspect of the present invention, there is provided an electronic component mounting method according to any one of the twelfth through seventeenth aspects, wherein the electrical connecting portions are solder bumps.

According to a nineteenth aspect of the present invention, there is provided an electronic component mounting method according to any one of the twelfth through seventeenth aspects, wherein the electrical connecting portions are lands.

According to a twentieth aspect of the present invention, there is provided an electronic component mounting apparatus characterized by comprising:

a component supply section of the electronic component defined in any one of the first through eleventh aspects;

a mounting head for moving the electronic component from the component supply section to a mounting position and mounting the electronic component on the printed board;

a mounting table on which the printed board to be mounted with the electronic component is placed;

a component inspecting section for recognizing the reference mark of the electronic component to be mounted; and a control section for executing quality check or positional correction in the mounting stage of the electronic component according to a result of recognition.

According to a twenty-first aspect of the present invention, there is provided an electronic component mounting apparatus characterized by comprising:

a component supply section of the electronic component defined in any one of the first through eleventh aspects;

a mounting head for moving the electronic component from the component supply section to a mounting position and mounting the electronic component on the printed board;

a mounting table on which the printed board to be mounted with the electronic component is placed;

a component inspecting section for recognizing the reference mark of the electronic component to be mounted;

a board recognizing section for recognizing a recognition mark of the mounting position of the printed board; and a control section for executing quality check or positional correction in the mounting stage of the electronic component according to a result of recognition.

According to a twenty-second aspect of the present invention, there is provided an electronic component mounting apparatus according to the twentieth or twenty-first aspect, wherein the reference mark obtained by coding information provided for the electronic component to be mounted is recognized by also using either the component inspecting section that recognizes the reference mark provided for the electronic component or the recognizing section that recognizes the recognition mark of the target mounting position on the printed board.

According to a twenty-third aspect of the present invention, there is provided an electronic component mounting apparatus according to any one of the twentieth through twenty-second aspects, wherein the reference mark is formed on the electronic component simultaneously with the electrical connecting portions.

According to a twenty-fourth aspect of the present invention, there is provided an electronic component mounting apparatus according to any one of the twentieth through twenty-third aspects, wherein the electrical connecting portions are solder bumps.

According to a twenty-fifth aspect of the present invention, there is provided an electronic component mounting apparatus according to any one of the twentieth through twenty-third aspects, wherein the electrical connecting portions are lands.

According to the above construction, the state of arrangement positions and the shapes of the whole solder bumps can be confirmed by providing the reference mark on the connecting surface side of the solder bump component to be mounted on the printed board.

Furthermore, by providing the reference mark on the surface opposite from the connecting surface of the solder bump component to be mounted on the printed board, the positional detection can be confirmed in appearance before or after the mounting.

Furthermore, the same operation is owned by the projection peculiar to the solder bump component or the print, and with the expression of the reference mark or the two-dimensional bar code obtained by coding information, the information for the mounting can be reliably obtained according to the discrimination information of each component.

The recognizing process for recognizing the reference mark provided on the electronic component to be mounted and the correcting process for executing the quality check of the electronic component or the positional correction in the mounting stage according to the result of the recognition are included to allow reliable solder bump component mounting to be executed.

By executing the first recognizing process for recognizing the reference mark provided on the electronic component to be mounted, the second recognizing process for recognizing the recognition mark of the target mounting position on the printed board, and the quality check or the positional correction according to both the results of the recognition of the first recognizing process and the second recognizing process, more reliable solder bump component mounting can be executed.

The quality check of the electronic component to be mounted includes the component inspecting process for checking the electronic component by the state of formation of the solder bumps recognized based on the relative position of the solder bumps with respect to the reference mark of the electronic component, and this process enables the confirmation of the shape states of the dislocation, solder dropout, insufficient solder amount, and so on of the solder bumps prior to the mounting.

The recognition of the reference mark obtained by coding the information is achieved while sharing either the process of recognizing the reference mark provided for the electronic component to be mounted or the process of recognizing the recognition mark of the target mounting position on the printed board, so that a structure that necessitates no separate detector for use in the electronic component inspecting and mounting position recognizing process can be provided.

Furthermore, at least one of the recognition marks on the printed board is the discrimination information of the component to be mounted expressed by the two-dimensional bar code obtained by coding the information, so that the confirmation of the electronic component to the mounting position can be executed to allow the elimination of faulty mounting.

BRIEF DESCRIPTION OF DRAWINGS

These and other aspects and features of the present invention will become clear from the following description taken in conjunction with the preferred embodiments thereof with reference to the accompanying drawings, in which:

FIG. 4 is a flowchart showing the mounting process of the first embodiment;

FIG. 5A is a view showing an example of the pattern of BG connecting portions of a BGA component according to a second embodiment of the present invention;

FIG. 5B is a view showing an example of parameter data of the arrangement of the BG connecting portions;

DETAILED DESCRIPTION OF THE INVENTION

Figure 1:
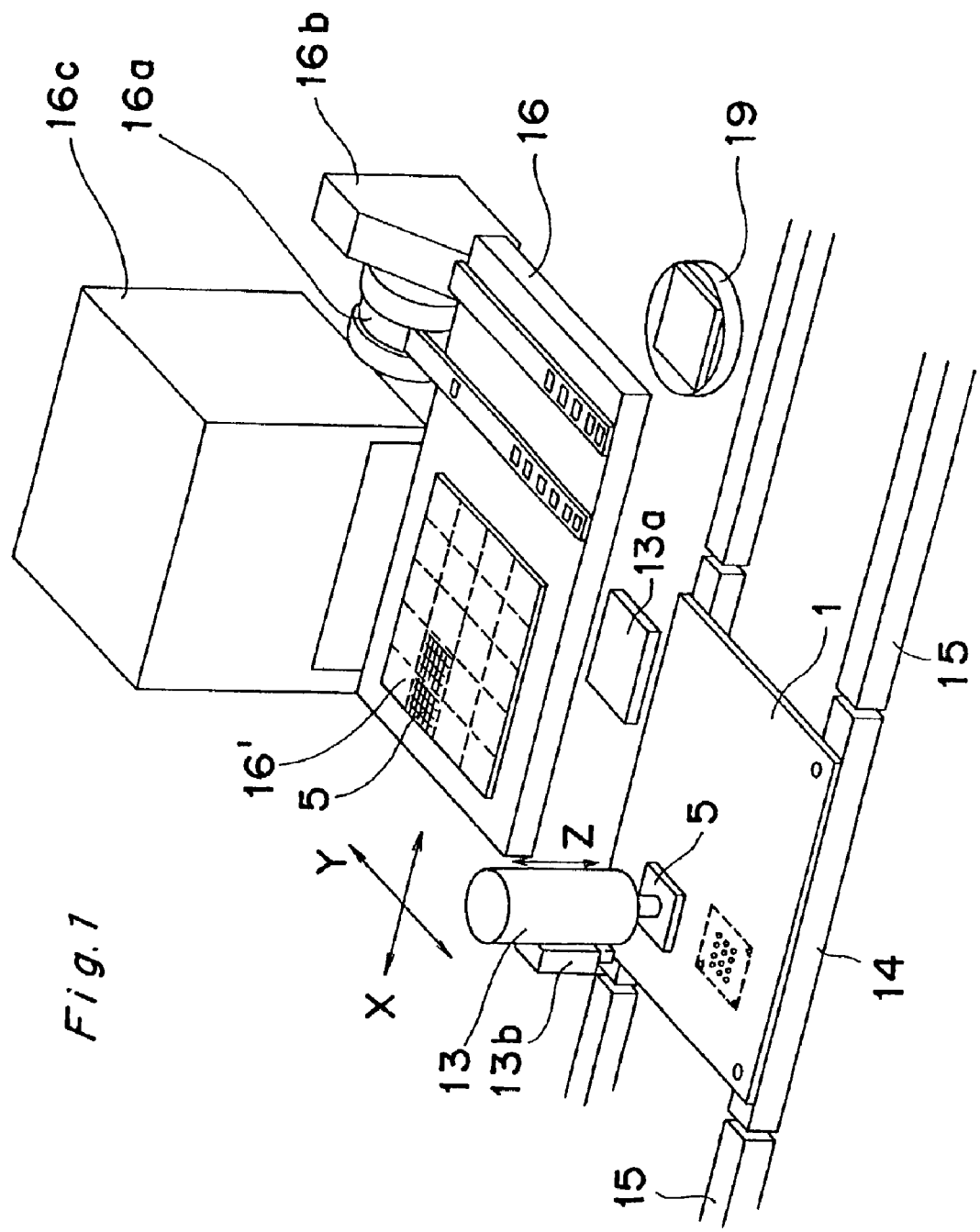
FIG. 1 is a perspective view showing part of the outline of a component mounting apparatus provided with the component mounting method according to a first embodiment of the present invention.

Before the description of the present invention proceeds, it is to be noted that like parts are designated by like reference numerals throughout the accompanying drawings.

A first embodiment of the present invention will be described in detail below with reference to the drawings.

Figure 16A:
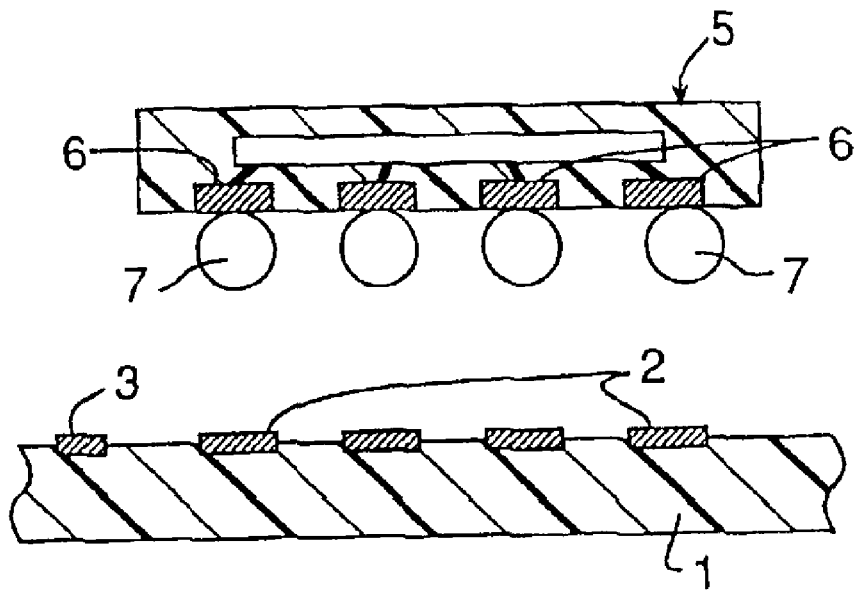
FIG. 16A is a sectional view of a conventional BGA component having solder bumps and a printed board.
Figure 16B:
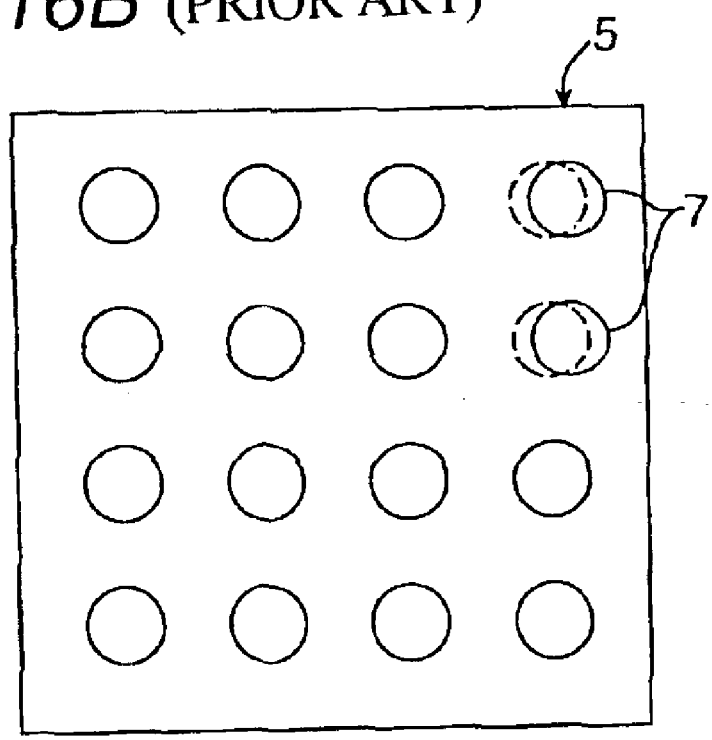
FIG. 16B is a bottom view of the BGA component.
Figure 17:
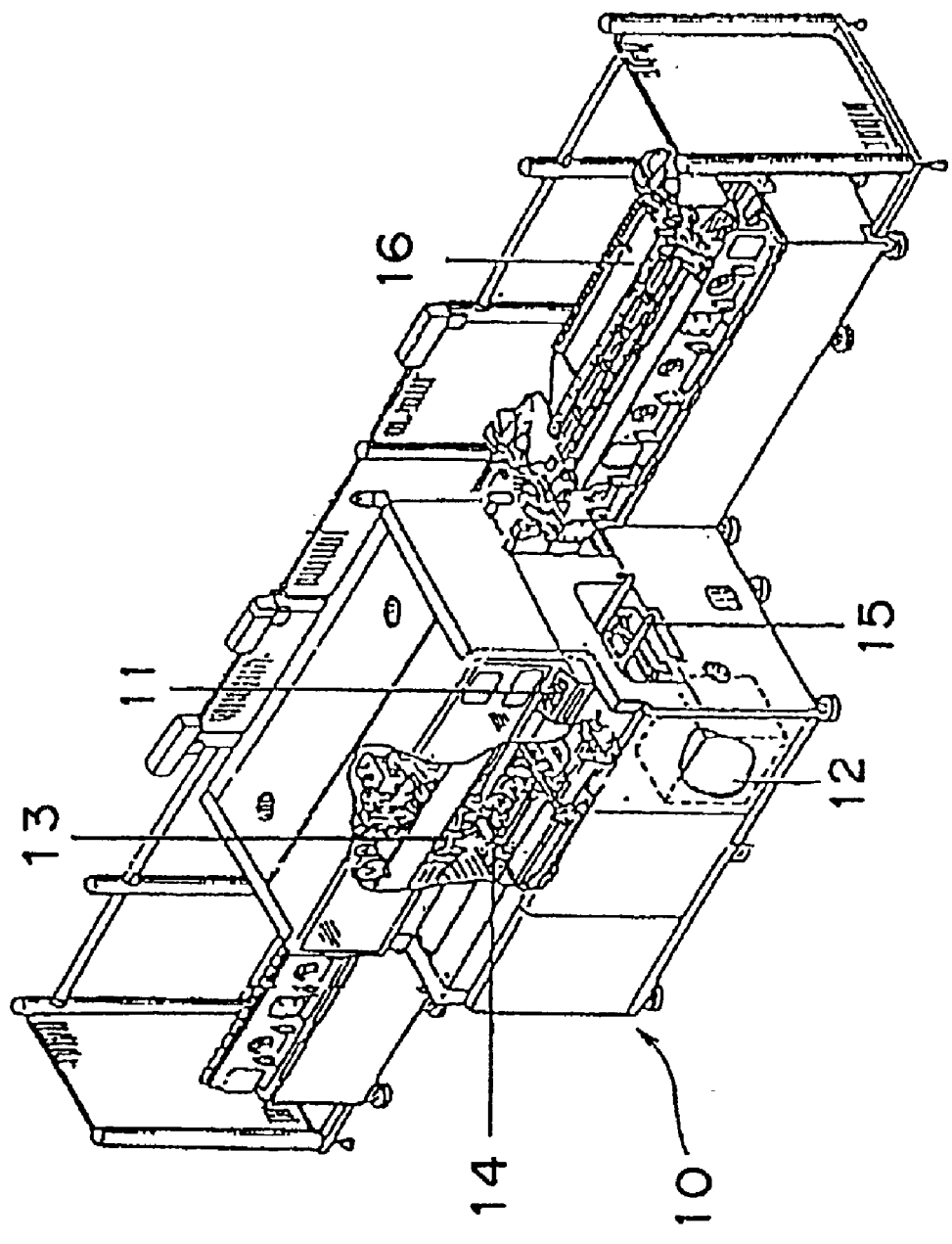
FIG. 17 is a partially see-through perspective view of the component mounting apparatus of a prior art example.
Figure 18:
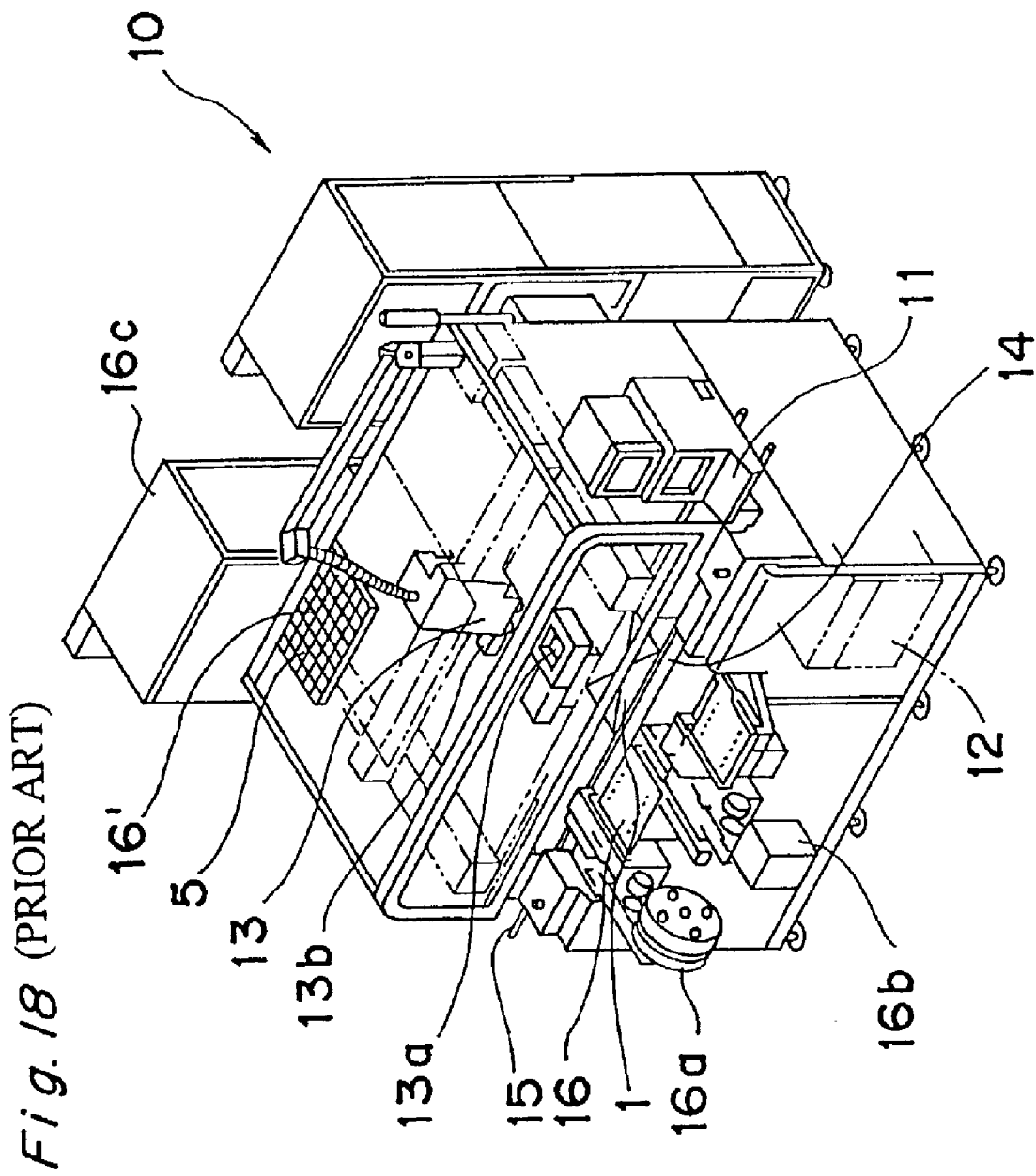
FIG. 18 is a partially see-through perspective view of a component mounting apparatus of another prior art example.

FIG. 1 is a perspective view showing an electronic component and the outline of a component mounting apparatus capable of implementing an electronic component mounting method, according to the first embodiment of the present invention. In this figure, the components that correspond to the constituent elements having substantially equivalent functions as the constituent elements shown in FIG. 14 and FIG. 16 which show the aforementioned prior art examples are denoted by the same reference numerals, and so forth in the figures described later. In FIG. 1, reference numerals denote respectively, 1 a printed board to be mounted with an electronic component, 13 a mounting head for holding an electronic component, 13a a component inspecting section for inspecting the posture and the like of the electronic component held by the mounting head, 13b a board recognizing section for recognizing a position recognition mark and the like of the board, 14 a mounting table for holding the board 1, 15 conveyance rails for conveying the board 1 to the mounting table 14, 16 a component supplying section for storing the electronic component to be mounted and supplying the component to the mounting head in a supply position, 16' a parts tray in which the electronic components are arranged in a matrix form, 16a a parts cassette in which components are stored on a tape, 16b a bulk cassette in which components are stored, 16c a parts tray storing section for storing the parts tray, and 19 a component scrapping section for scrapping the component that is determined to be defective in the component quality check stage. It is to be noted that the printed board 1 is conveyed by the conveyance rails 15 to the mounting table 14 for mounting the component before a mounting starting process S1, and the printed board 1 that has undergone a specified mounting process is conveyed to the outside by the conveyance rails 15 after a mounting ending process S10, the steps being described later. Further, the component supplying section 16 of the electronic component mounting apparatus can be mounted with the tape-shaped parts cassette 16a, the bulk cassette 16b for components stored in a scattered form, the plate-shaped parts tray 16', and the like, which serve as a removable component set for continuously supplying the components.

Figure 2:
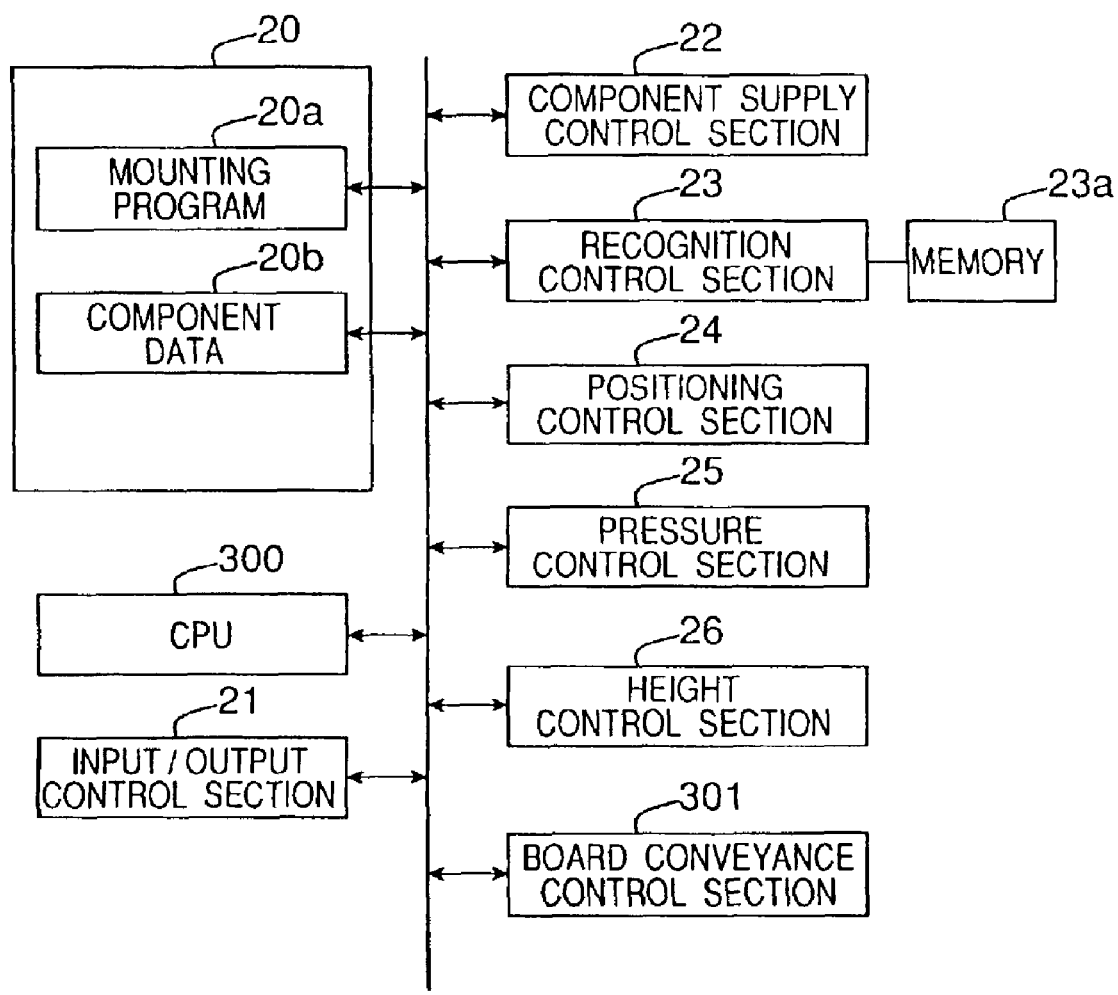
FIG. 2 is a block diagram showing the outline of a control section for executing the mounting control of the component mounting apparatus of the first embodiment.

FIG. 2 is a block diagram showing the outline of a control section for executing mounting control of the component mounting apparatus. In FIG. 2, reference numerals denote respectively, 20 a storage section provided with a mounting program storage section 20a and a component data storage section 20b, 21 an input/output control section, 22 a component supply control section, 23 a recognition control section, 24 a positioning control section, 25 a pressure control section, 26 a height control section, and 300 a CPU. The mounting program storage section 20a stores: mounting data such as a mounting sequence, component names, mounting positions (X, Y, θ), and supply positions of components to be supplied; and a program for executing the mounting process. The component data storage section 20b stores information such as component names, component (appearance) shapes (widths, lengths, heights), colors, reference mark positions with respect to component body dimensions (appearance or external ends) or reference mark positions with respect to the centers of the components, patterns (arrangement positions) of the lands of BG connecting portions with respect to the reference marks, reference mark shapes (the center of gravity and positions of the vertex and the sides in the case of a triangular reference mark; the center of gravity and positions of the corners and the sides in the case of a rectangular reference mark; the center or the center of gravity in the case of a circle or dot reference mark), the ball shape (including sphere, sphere diameter, and so on) in each arrangement position, information of the presence or absence of a ball, and so on. The CPU 300 issues whole mounting commands and instructions to each of the driving units and so on. The input/output control section 21 is to execute input and output of the mounting program and the component data by manual input or by an FD or communications. It is otherwise acceptable to directly execute the input and the output of data of the actual X- and Y-positions, angle, pressure, and the like on the component supply control section 22, the positioning control section 24, the height control section 26, and the pressure control section 25, not by way of the input/output control section 21. The component supply control section 22 drives the component supply section of a tray, a cassette, or the like, and then supplies an appropriate component to a component supply position. The recognition control section 23 executes the recognition of the component, reference marks of the component and the board, IC marks, arrangement patterns, and so on, executes comparison with the data stored in the component data and the mounting program, and calculates a difference between them. It is to be noted that this calculation may be executed by another control section, CPU, or the like. The positioning control section 24 controls the X-Y driving and (-rotatory driving of the mounting head according to the above recognition information, while the pressure control section 25 controls the pressure in the mounting stage and component suction stage. The height control section 26 executes driving control of the mounting head in the Z-direction (the direction perpendicular to the X- and Y-directions). It is to be noted that the board conveyance is executed by a board conveyance control section 301.

Figure 3A:
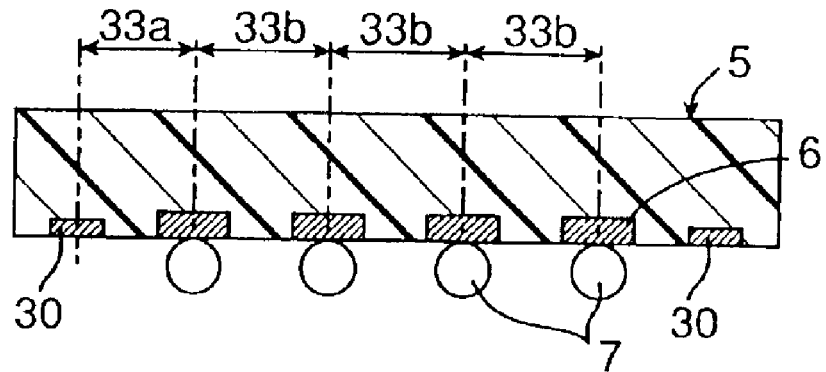
FIG. 3A is a sectional view of a BGA component according to an example of the electronic component handled by the component mounting apparatus of the first embodiment.
Figure 3B:
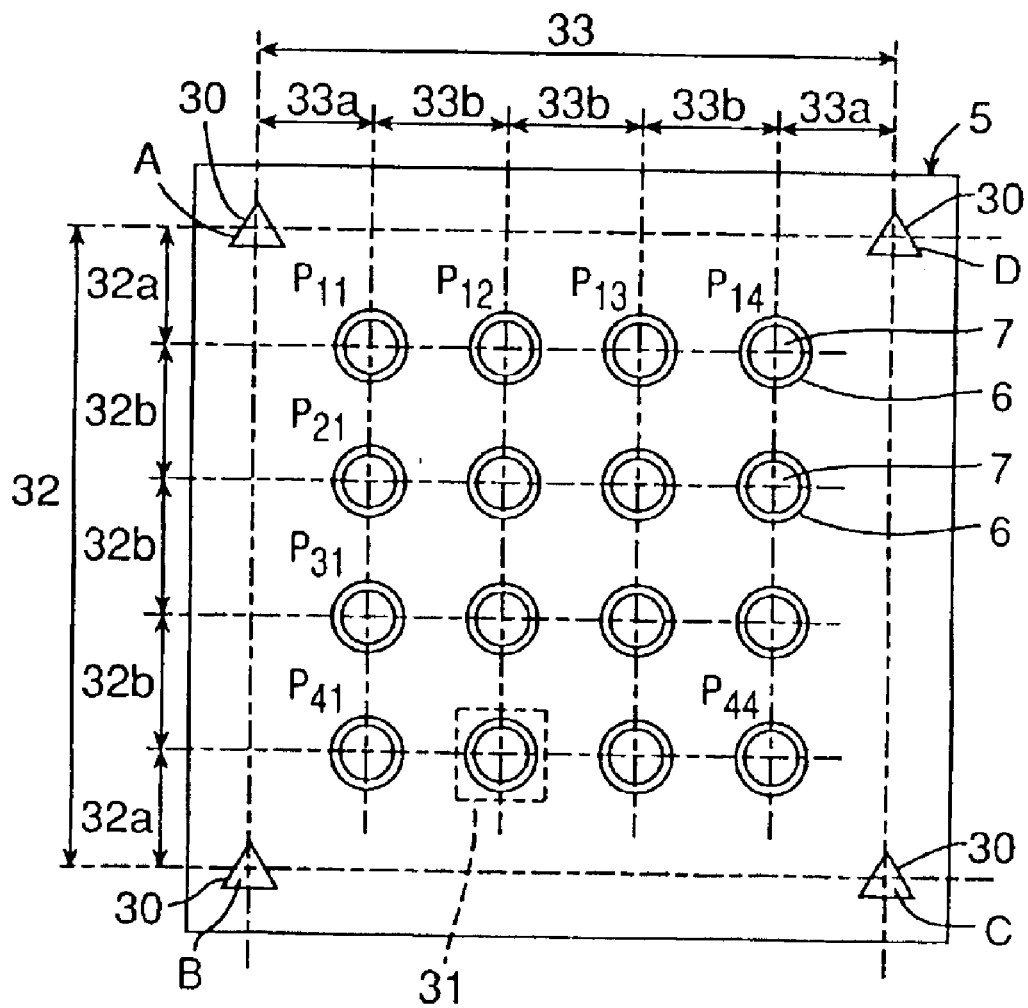
FIG. 3B is a bottom view of the BGA component.

Further, FIG. 3A is a sectional view of a BGA component according to an example of the electronic component handled by the component mounting apparatus of the first embodiment, while FIG. 3B is a bottom view of the BGA component. In FIGS. 3A and 3B, reference numerals denote respectively, 5 a BGA component, 6 BG connecting portions of electrodes $P_{11}$ through $P_{44}$ of the circuit board, 7 solder bumps provided for the BG connecting portions 6, 30 four reference marks A, B, C, and D that serve as a reference of the positions where the BG connecting portions 6 are arranged, 31 a recognition window for use in a recognition process by means of a CCD camera or the like, 32 a mark-to-mark pitch between A and B of the reference mark 30, 32a a pitch between A of the reference mark 30 and the electrode $P_{11}$ and between B of the reference mark 30 and the electrode $P_{41}$, 32b an adjacency pitch between the electrode $P_{11}$ and the electrode $P_{21}$, between the electrode $P_{21}$ and the electrode $P_{31}$, and between the electrode $P_{31}$ and the electrode $P_{41}$, 33 a mark-to-mark pitch between A and D of the reference mark 30, 33a a pitch between A of the reference mark 30 and the electrode $P_{11}$ and between D of the reference mark 30 and the electrode $P_{14}$, and 33b an adjacency pitch between the electrode $P_{11}$ and the electrode $P_{12}$, between the electrode $P_{12}$ and the electrode $P_{13}$, and between the electrode $P_{13}$ and the electrode $P_{14}$.

In this case, a method for forming the reference marks 30 at the same time as the BG connecting portions (lands) 6 are formed on the BGA component 5 will be described with reference to FIG. 13A and FIG. 13B.

Figure 13A:
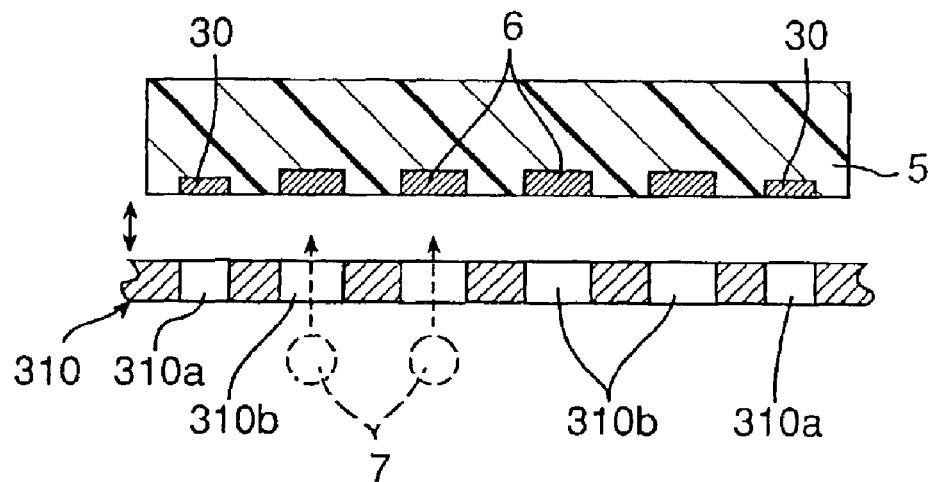
FIG. 13A is an explanatory view showing a method for concurrently forming a reference mark and BG connecting portions in the above embodiment.

In FIG. 13A, by means of a mask 310, the lands 6 are formed on the lower surface of a component that becomes the BGA component 5 while the reference marks 30 are simultaneously formed by printing, plating, or the like. This mask 310 is provided with BG connecting portion-forming-through holes 310b located in the positions where the BG connecting portions 6 are formed and reference mark-forming-through holes 310a located in positions where the reference marks 30 are formed. After forming the reference marks 30 simultaneously with the BG connecting portions 6 by means of the mask 310, the solder bumps 7 are formed on the BG connecting portions 6 by using the mask 310 as needed. Consequently, the BG connecting portions 6 and the reference marks 30 are formed integrally and simultaneously with each other. Therefore, even if the BG connecting portions 6 are dislocated with respect to the BGA component 5, then the reference marks 30 are also dislocated. Therefore, if only the positions of the reference marks 30 can be correctly detected, then the dislocation of the BG connecting portions 6, i.e., the dislocation of the solder bumps 7 can be correctly detected. In forming the solder bumps 7, the dislocation of the solder bumps 7 can also be prevented by utilizing the reference marks 30. It is to be noted that the solder bumps 7 are not formed in the case of the bump-less component that needs no solder bump 7. That is, in this case, the reference marks 30 are used as a reference of the arrangement positions of the lands on which no solder bump is formed, the lands being an example of the electrical connecting portion.

Figure 13B:
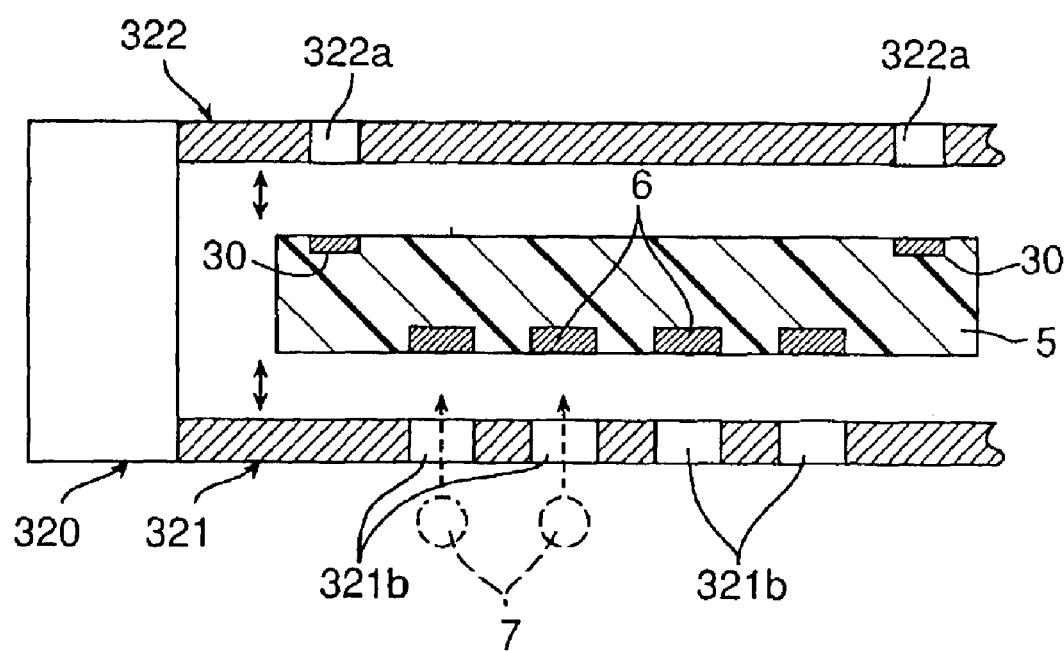
FIG. 13B is an explanatory view showing another method for concurrently forming a reference mark and BG connecting portions in the above embodiment.

In FIG. 13B, the lands 6 are formed on the lower surface of a component that becomes the BGA component 5 by means of a lower mask 321 while the reference marks 30 are simultaneously formed by printing, plating, or the like on the upper surface of the component that becomes the BGA component 5 by means of an upper mask 322. This lower mask 321 is provided with BG connecting portion-forming-through holes 321b located in positions where the BG connecting portions 6 are formed, and reference mark-forming-through holes 322a are located in positions of the upper mask 322 where the reference marks 30 are formed. After forming the reference marks 30 simultaneously with the BG connecting portions 6 by means of the lower mask 321 and the upper mask 322, the solder bumps 7 are formed on the BG connecting portions 6 by using the mask 321 as needed. Consequently, the BG connecting portions 6 and the reference marks 30 are formed integrally and simultaneously with each other. Therefore, even if the BG connecting portions 6 are dislocated with respect to the BGA component 5, then the reference marks 30 are also dislocated. Therefore, if only the positions of the reference marks 30 can be correctly detected, then the dislocation of the BG connecting portions 6, i.e., the dislocation of the solder bumps 7 can be correctly detected. It is to be noted that the reference numeral 320 denotes a mask support member for independently movably supporting the lower mask 321 and the upper mask 322 with respect to the BGA component 5. In forming the solder bumps 7, the dislocation of the solder bumps 7 can also be prevented by means of the reference marks 30. It is to be noted that the solder bumps 7 are not formed in the case of a bump-less component which needs no solder bump 7. That is, in this case, the reference marks 30 are used as a reference of the arrangement positions of the lands on which no solder bump is formed, the lands being an example of the electrical connecting portions.

Figure 14A:
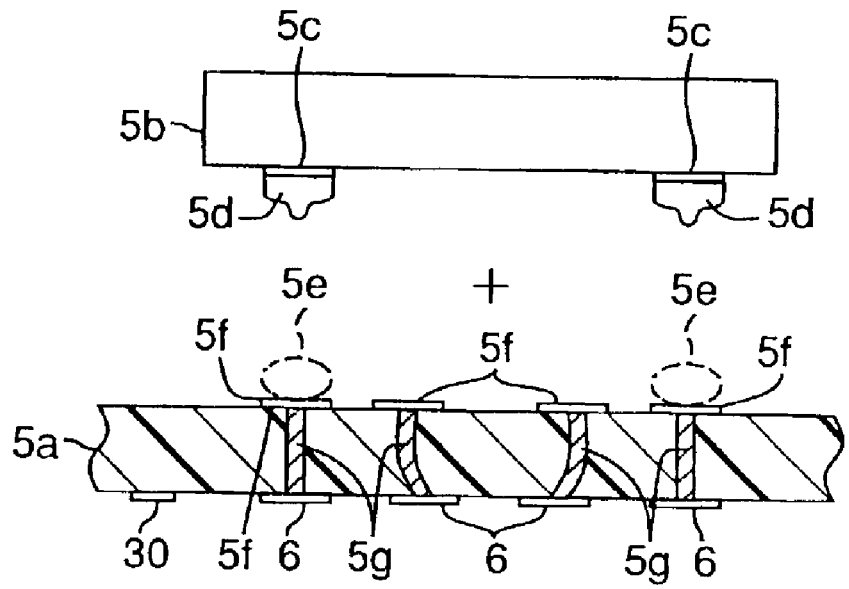
FIG. 14A is an explanatory view showing a method for forming a component of CSP or the like in the above embodiment.
Figure 14B:
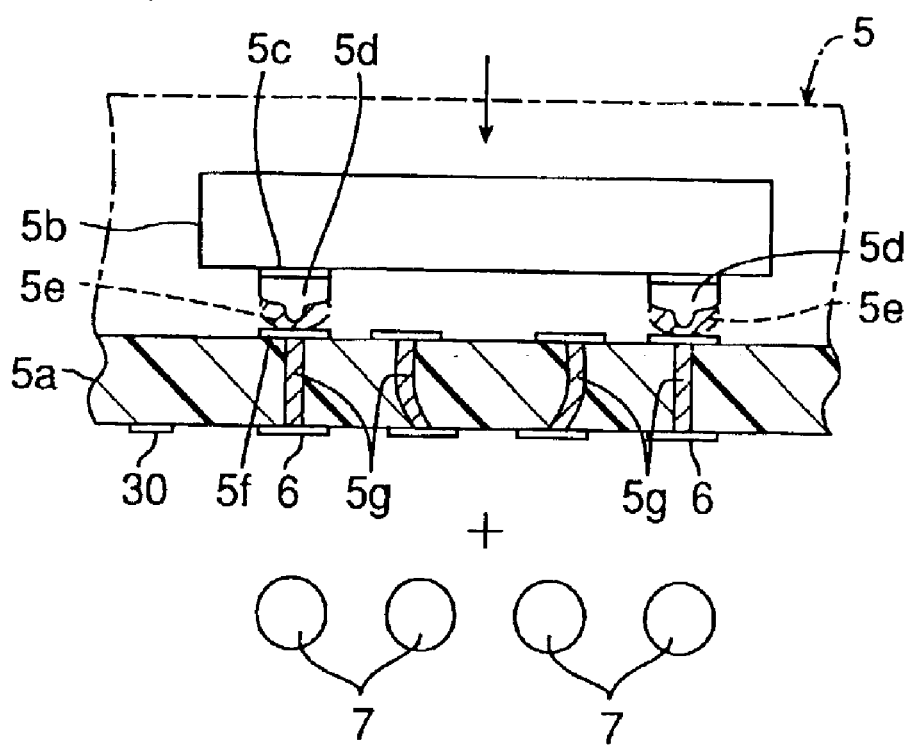
FIG. 14B is an explanatory view showing another method for concurrently forming a reference mark and BG connecting portions on the component formed in FIG. 14A.

The BG connecting portions 6 and the solder bumps 7 in the case where the BGA component 5 is CSP will be described with reference to FIG. 14A and FIG. 14B.

On the lower surface of an IC chip 5b are preparatorily formed gold bumps 5d via aluminum electrodes 5c. This IC chip 5b is bonded with pressure via silver paste 5e on upper electrodes 5f of a single-layer or multi-layer carrier board 5a made of glass epoxy or ceramic and then encapsulated with resin to be formed into the complete BGA component 5. The BG connecting portions 6 are to be electrically connected to the upper electrodes 5f by wirings 5g that penetrate the carrier board 5a, and the reference marks 30 are formed simultaneously with each other on this carrier board 5a, as shown in FIG. 13A. Subsequently, the solder bumps 7 are formed. It is to be noted that the solder bumps 7 are not formed in the case of a bump-less component which needs no solder bump 7.

The electrical connecting portions of, for example, the lands and the BG connecting portions 6 often have a circular shape, and therefore, the reference mark 30 preferably has a triangular shape or the like other than the circular shape so as to facilitate the discrimination of the reference mark from the shape. If the triangular shape is adopted, it is easy to specify the direction of the triangle according to the positions of the sides and the positions of the vertexes. For example, if the reference mark 30 is constructed of a mark of one isosceles triangle defined so that the direction parallel to the base different from the equi-length sides is a Y-direction and the direction perpendicular to the base is an X-direction, then the X-Y coordinates can be easily defined based on the reference mark 30 and the arrangement positions and patterns of the lands and the BG connecting portions 6 or the solder bumps 7 can be correctly detected. If the reference mark 30 is constructed of two equilateral triangles defined so that a line connecting the centers of gravity of the equilateral triangles is, for example, a Y-direction and the direction perpendicular to this direction is an X-direction, then the X-Y coordinates can be easily defined and the arrangement positions and patterns of the lands and the BG connecting portions 6 or the solder bumps 7 can be correctly detected. In this case, if the X-Y coordinates are defined, then the angle of arrangement inclination of the electrical connecting portion with respect to the end portion or the like that serves as a reference of the external shape of the electronic component can be easily obtained through calculation.

The reference mark 30 is preferably formed at a corner portion of the electronic component so as not to interfere with the arrangement of the electrical connecting portions such as the BG connecting portions 6 or lands, and the angle of inclination of the whole electrical connecting portions is made easy to be detected.

FIG. 3B shows the BGA component 5 on which a plurality of solder bumps 7 or the BG connecting portions 6 (electrodes $P_{11}$ through $P_{14}$) formed on the bottom surface of the BGA component 5 are arranged in a matrix pattern at adjacency pitches of 32b and 33b. The reference marks 30 provided for the BGA component 5 serve as reference points formed simultaneously with these BG connecting portions 6.

For example, A and B of the reference marks 30 and A and D of the reference marks 30 are arranged vertically at mark-to-mark pitches 32 and 33, while A of the reference mark 30 and the electrode $P_{11}$, of the BG connecting portion 6 are arranged with the relative positional relation of pitches 32a and 33a. Likewise, the other electrodes $P_{12}$ through $P_{44}$ are arranged with relative positional relations to A of the reference mark 30. The relative relation between B of the reference mark 30 and the electrode $P_{41}$ and the relative relation between D of the reference mark 30 and the electrode $P_{14}$ are assured with specified accuracy at the pitches 32a and 33a in the similar manner, and therefore, the reference marks B, C, and D can be used as a supplementary. These pieces of information are stored in the component data storage section 20b.

FIG. 4 is a flowchart showing the mounting process of the first embodiment of the present invention. This flowchart showing the mounting process will be described with reference to FIG. 1 and FIG. 2. This mounting apparatus is to mount an electronic component on the board 1. On the component supplying section 16 are provided necessary amounts and sorts of electronic components for the mounting apparatus, and the electronic components are supplied to the mounting head 13 that holds the electronic component needed every moment and mounts the component on the printed board 1.

First, the mounting apparatus is activated to start the mounting process (S1).

In a control instruction reading process, the mounting program is read from the mounting program storage section 20a of the storage section 20, and various control operations of specified processing in the mounting process will be successively executed according to the instructions of the program (S2). In this case, the CPU 300 controls each control section according to an NC program of the mounting program 20a. In practice, the board 1 is conveyed to the mounting table 14, and the component 5 supplied from a specified component supplying section 16 is held by the mounting head 13. The component is recognized by the component inspecting section 13a, while the board 1 is recognized by the board recognizing section 13b. Correction is executed by comparison with the component data and the data of the NC program, and the component 5 is mounted on the board 1.

In a component take-out process, the electronic component that is necessary for the mounting and is supplied from and held in the component supplying section 16 is positioned with respect to the mounting head 13, taken out, and held (S3).

When the component is the BGA component 5 shown in FIGS. 3A and 3B, the component 5 is positioned by the mounting head 13 in the component inspecting section 13a through a component recognizing process provided with the positional detection and the inspection method of the component by means of the reference marks 30. Through the above process, the component position detection of the component 5 by means of the reference marks 30 is executed in the recognition window 31 (see FIG. 3B), and correction is executed in the correction process included in the same process by checking the holding posture. That is, the component recognizing section is moved into the component reference position stored in the component data storage section 20b to seek the reference position of the component and seek the reference marks 30 from the contour or the center of the component. If there is one reference mark 30 of a triangular shape, a rectangular shape, or a cross shape in this stage, then the component position and the deviation in angle are recognized by the one reference mark 30. If there are two or more reference marks 30, then the two reference marks 30 are sought and thereafter the deviation in angle of the component is recognized by a line or lines that connects the two reference marks 30. Subsequently, the recognition window of a CCD camera or a 3D sensor is moved step by step to recognize the position of each of the BG connecting portions 6 and the states of the bumps 7. Then, on the basis of the recognition data, the following three ways of correction can be considered. The first way is to preparatorily correct the component position and posture on the basis of deviations in the X-, Y-, and θ-directions of the recognized component 5, and then scan the BG connecting portions 6. The second way is to store the deviations in a memory 23a, calculate the deviations together with the deviations of the board 1 in the board recognizing stage as described later, and finally execute a correcting process. The third way is to execute scanning while changing the direction of movement (scanning direction) of the recognition window by means of a scanner according to the deviations. Thereafter, the mounting is executed by correcting the positions of the component 5 and the board 1. Concurrently with this, the defects, dislocations, and shapes of the solder balls are recognized. Further, the quality check of the component is executed by the component inspecting method using the reference mark(s) 30 as a reference position. If any component defect of dropout, dislocation, insufficient solder amount, or the like of the solder bump(s) 7 at the BG connecting portions(s) 6 is detected, then the specified display or warning of "component PAAAA solder ball dropout" or the like is displayed on, for example, an operation monitor (not shown) of an operating section, and a calculating process is executed. The component is scrapped into the component scrapping section 19 (S4).

If the component is normal, then the mounting head 13 that is holding the component is moved close to the mounting position of the printed board 1 on the mounting table 14 in a mounting position determining process (S5).

In a board mounting position recognizing process, the target mounting position recognition marks 30 of the printed board 1 shown in FIG. 3A is confirmed and recognized by the board recognizing section 13b as needed (S6).

In a determination (check) correcting process after the mounting position detection, the mounting position is corrected by securing a high degree of accuracy through the mounting position determination correcting process together with the foregoing component inspection results (S7).

In a component mounting process, the mounting head 13 is lowered under the control of the height control section 26 so as to execute the mounting of the component 5 on the board 1 (S8).

Figure 19:
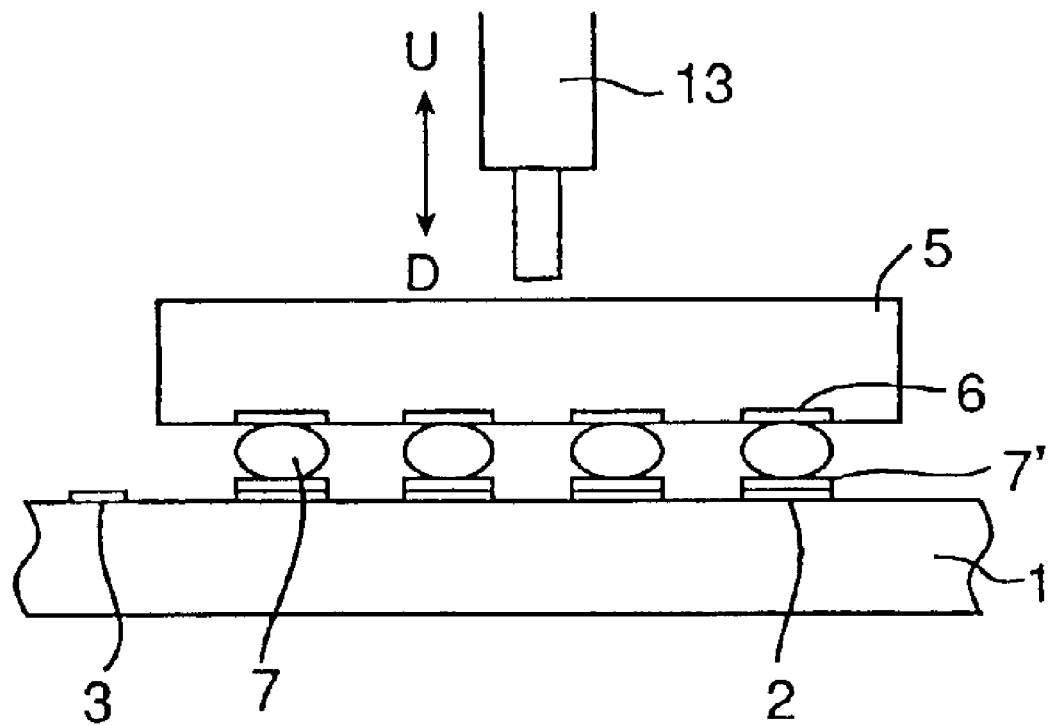
FIG. 19 is a sectional view showing the mounting of a BGA component by the conventional component mounting apparatus shown in FIG. 18.

In this stage, the diameters of the spheres are detected according to the inspection results of the sizes, variations, and so on of the solder bumps 7 at the BG connecting portions 6 in the case of the spherical solder bumps. Therefore, it is also allowed to obtain the average height of the BGA component 5 on the basis of the detected diameters, obtain a gap between the BGA component 5 and the printed board 1 through optimization and execute the calculation of the optimum control of the height control section 26 of the mounting head 13 or the optimum control of the pressure control section 25 for pressing the component in mounting as described in connection with the prior art example shown in FIG. 19.

Subsequently, the presence or absence of the next component to be mounted is checked, and the program flow proceeds to the process S1 when the mounting process is to be continued or to the process S10 when the mounting process is to end (S9).

Through the ending process, the mounting processes on the printed board 1 are completed (S10).

In the case of the conventional positional detection, the component center point is (generally) obtained from the component contour as an arbitrary regulation position needed for the mounting according to the external contour of the component or the pattern of the connecting portions through image processing. According to this positional detection, the solder bumps 7 on the BG connecting portions 6 have a round shape and a variation in arrangement, and this causes a difference from the true center of the BG connecting portions 6. In the case of the BGA component 5 of the present first embodiment, the reference marks 30 formed simultaneously with the pattern arrangement of the BG connecting portions 6 are used as a reference position instead of the component contour. Therefore, by virtue of A, B, and D of the reference marks 30, the position of the center that becomes an arbitrary regulation position needed for the mounting is easily detected.

Therefore, the center position can be obtained easily and more correctly as an arbitrary position of the connecting patterns without receiving influence of the variation of the external contour or the connecting portions.

Further, as shown in FIG. 3B, the arrangement of the BG connecting portions 6 of the electrodes $P_{11}, P_{12}, \ldots, P_{44}$ in the connecting portion pattern can be easily obtained by the pitches 32a and 33a and the adjacency pitches 32b and 33b using the reference marks 30 as a starting point. If the recognition window 31 for executing the image processing is arbitrarily arranged on the electrodes $P_{11}, P_{12}, \ldots, P_{44}$ of the target BG connecting portions 6 in order to confirm whether the solder bumps 7 on the BG connecting portions 6 have been formed in conformity to the specifications, then the confirmation and inspection by the quality check of the dislocations, solder dropouts, and insufficient solder amounts can be easily achieved for the positional detection of the solder bumps 7 and the solder bump formation state, so that high-quality supply and mounting of the BGA components 5 on the printed board 1 can be achieved.

In the control instructions of the mounting program, the processing of the various processes described with reference to the flowchart of FIG. 4 can be rearranged by a specification, and the sequence of the processes is arbitrarily changed or simultaneously executed according to the specified instructions decoded through the control instruction reading process (process S2).

For example, the relative positions of the pattern arrangement of the BG connecting portions 6 and the reference marks 30 are correct in the component recognizing process (process S4). Therefore, the component 5 can be mounted in the specified mounting position only by the positional detection of the reference marks 30 if there is neither the board mounting pattern dislocation nor arrangement dislocation, and this simple processing is able to reduce the mounting cycle time loss.

Next, FIG. 5A shows an example of a pattern of BG connecting portions of a BGA component according to a second embodiment of the present invention, while FIG. 5B is a view showing an example of parameter data of the arrangement of the BG connecting portions. In FIGS. 5A and 5B, reference numerals denote respectively, 5 a BGA component, 6 BG connecting portions (electrodes $P_{11}$ through $P_{44}$), 30 reference marks, 31 a recognition window, 35 arrangement parameter data, and 36 data bits.

The arrangement of the electrodes $P_{11}, P_{12} \ldots, P_{44}$ of the pattern of the BG connecting portions 6 shown in FIG. 5A is translated into a model as shown in FIG. 5B in the form of the arrangement parameter data 35 of the BG connecting portions 6. According to this model, in the case of the example of the BG connecting portions 6 arranged in a matrix form shown in FIG. 5A, $P_{LC}$ is considered as the arrangement parameter data 35. In this case, PLC is the data expressing the presence or absence of the BG connecting portions 6 of all the columns in a row L. For example, $P_{1C}$ in the first row corresponding to $P_{11}$ through $P_{14}$ can be expressed by 1111, $P_{2C}$ in the second row corresponding to $P_{21}$ through $P_{24}$ can be expressed by 1001, $P_{3C}$ in the third row corresponding to $P_{31}$ through $P_{34}$ can be expressed by 1001, and $P_{4C}$ in the fourth row corresponding to $P_{41}$ through $P_{44}$ can be expressed by 1111. As described above, the arrangement can be easily expressed by simple data bits

36. In the above data, the number 1 indicates a data bit meaning that the BG connecting portion 6 is present, while the number 0 indicates a data bit meaning that the BG connecting portion 6 is absent.

With regard to the PLC position of row L and column C in the second embodiment, the number "1" indicates the "presence" of the BG connecting portion, while the number "0" indicates the "absence" of the BG connecting portion. Through this modeling, the various connecting portion arrangement patterns as shown in FIGS. 20A through 20J can be expressed by simple data. By combining the pitches 32a and 33a with the adjacency pitches 32b and 33b by means of the reference marks 30, the pattern shape of the whole arrangement of the BG connecting portions 6 of each BGA component 5 and the presence or absence and the positions of the solder bumps 7 thereof can be easily detected.

Otherwise, by detecting the arrangement parameter data 35 and utilizing the data as a parameter of the inspection target when there is no need for detecting the BG connecting portions 6 by the recognition window 31 and the positional detection and inspection are partially executed, effective positional detection and component inspection can be achieved by laying a mask for setting the recognition window or setting the recognition window 31 for image processing on only an arbitrary BG connecting portion(s) 6.

Furthermore, by previously giving the arrangement parameter data 35 of each component in addition to the to-be-mounted component data and the like to the component data storage section 20b of the storage section 20 as described in connection with the first embodiment shown in FIG. 2, the present embodiment can flexibly cope with a variety of modes of a component inspection method for selecting an algorithm of a higher certainty and higher reliability through the simple inspection of the BG connecting portions 6, determination (check) level designation of the scrapping process, a method for displaying the specified warning, and the like.

Figure 6A:
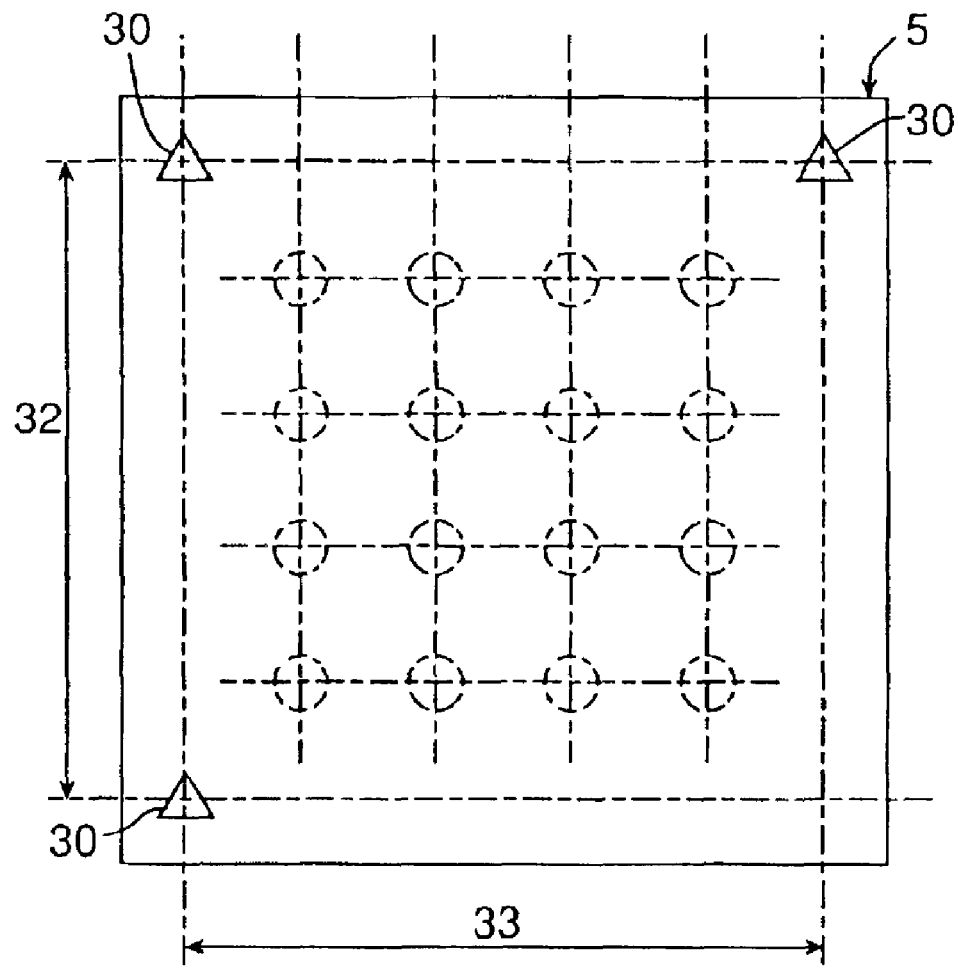
FIG. 6A is a front view of a reference mark provided on the surface opposite from the surface that has BG connecting portions of a BGA component according to a third embodiment of the present invention.
Figure 6B:
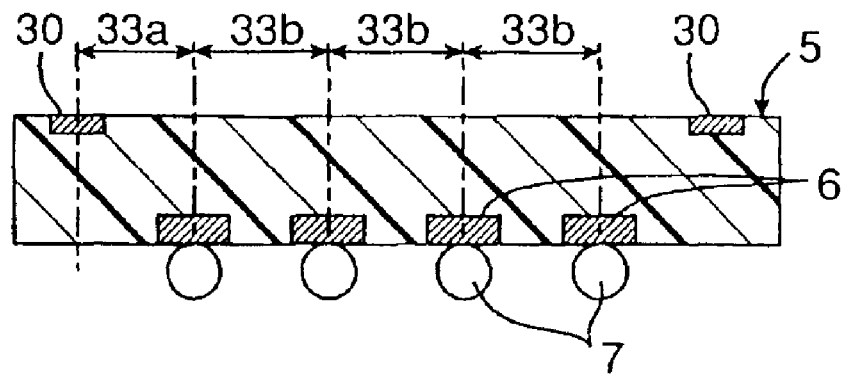
FIG. 6B is a sectional view of the above.

Next, FIG. 6A is a front view of reference marks provided on the surface opposite from the surface that has BG connecting portions of a BGA component according to a third embodiment of the present invention, while FIG. 6B is a sectional view of the above.

In the third embodiment, the reference marks 30 are provided on the surface opposite from the surface that has the BG connecting portions 6, differently from the aforementioned first embodiment. The reference marks 30 are provided on the surface opposite from the surface on which the BG connecting portions 6 and the solder bumps 7 are provided. However, the BG connecting portions 6 and the reference marks 30 are simultaneously formed, and therefore, the relative positional relation is assured.

A mounting method of the BGA component 5 will be described. In the component take-out process (process S3) of the flowchart shown in FIG. 4, the component necessary for the mounting is supplied to and held in the component supplying section 16, while the mounting head 13 executes the positioning of the necessary component in the component supplying section 16. When taking out the component, component position detection is executed by using the reference marks 30 that have been provided on the upper surface of the electronic component (BGA component 5) as a reference position by the board recognizing section 13 in the component recognizing process (process S4). Correction is executed in the correcting process of the same process S4 by checking the holding posture, and the component is held by the mounting head 13. If the processes S5 through S8 are subsequently executed, then a specified mounting quality can be assured and further the component inspecting section 13a becomes unnecessary, so that an inexpensive mounting apparatus can be achieved.

When further improving the mounting quality, there is executed the operations of moving the component to the component inspecting section 13a in the component recognizing process (process S4), executing the pattern detection of the BG connecting portions 6 that have relative positional relations with the reference marks 30 that are existing on the upper surface, and executing the quality check of the component by the component inspecting method using the reference marks 30 as reference points. If the component defect(s) of the dropout(s), dislocation(s), the insufficient solder amount(s), or the like of the solder bumps 7 of the BG connecting portions 6 is detected, the specified displaying, warning, and calculating processes are executed, and the component is scrapped into the component scrapping section 19. It is to be noted that this component quality check process can also be applied to the component inspection in the component manufacturing stage.

Figure 7A:
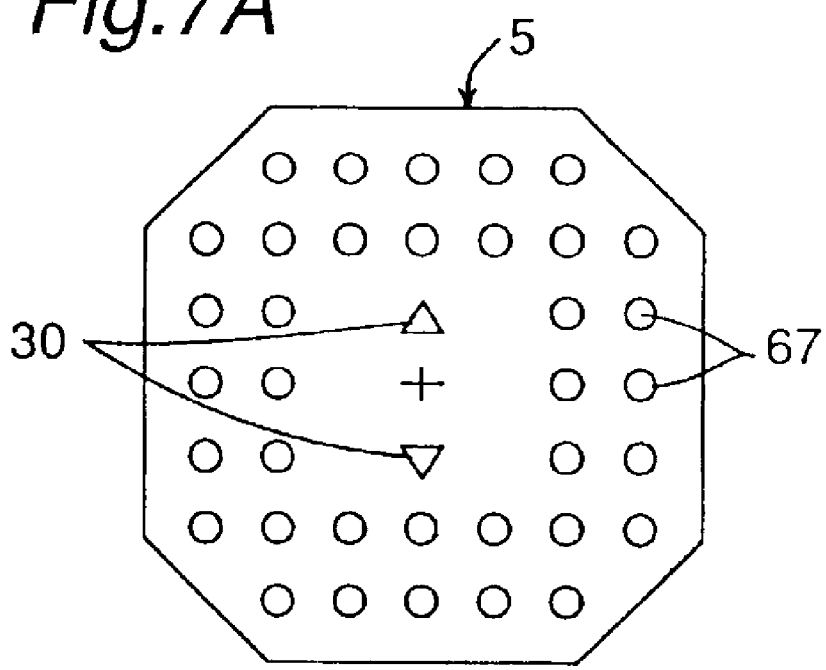
FIG. 7A is a view showing an example of a reference mark position according to a fourth embodiment of the present invention.
Figure 7B:
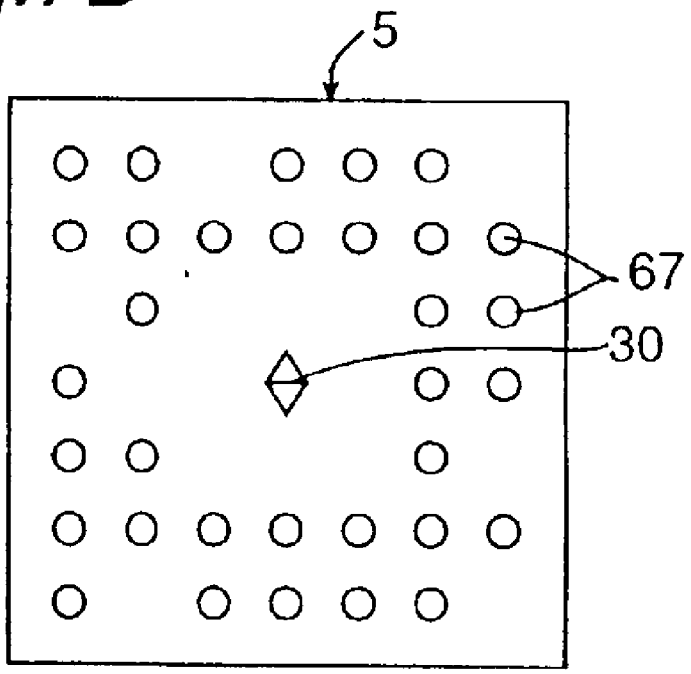
FIG. 7B is a view showing another example thereof.
Figure 20A:
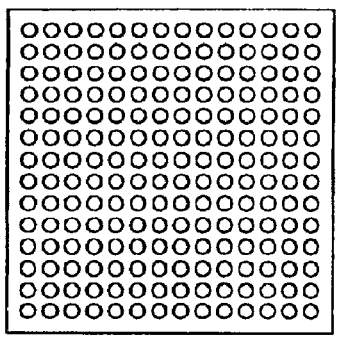
FIGS. 20A through 20J are views showing the BG connecting portion arrangement pattern on the connecting surface of the conventional BGA component.
Figure 20B:
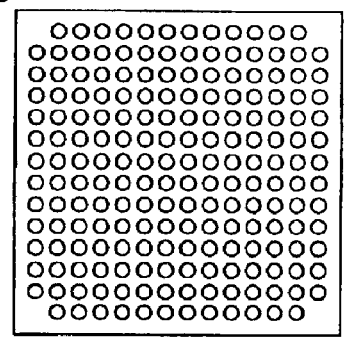
Figure 20C:
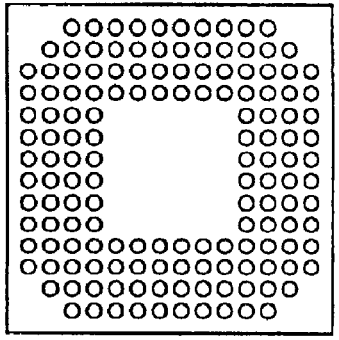
Figure 20D:
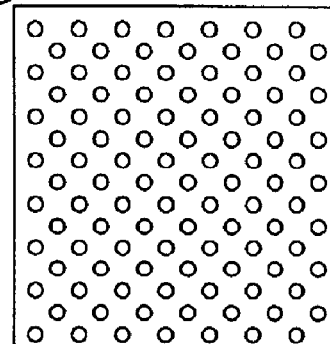
Figure 20E:
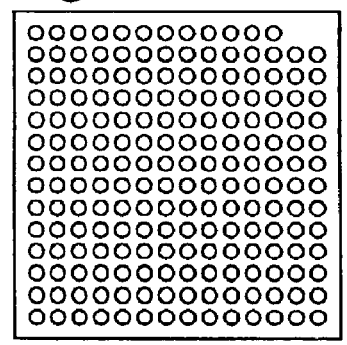
Figure 20F:
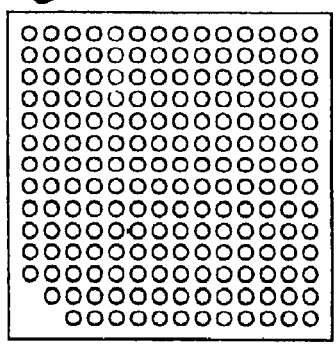
Figure 20G:
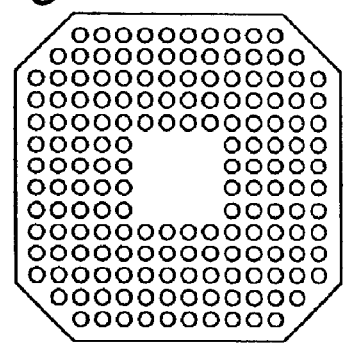
Figure 20H:
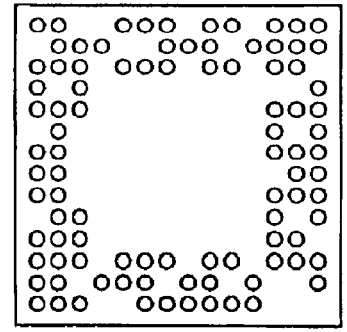
Figure 20I:
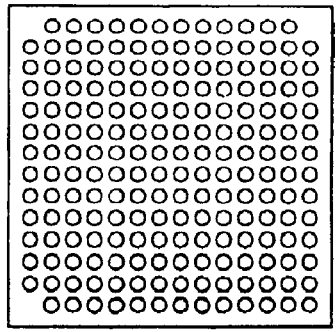
Figure 20J:
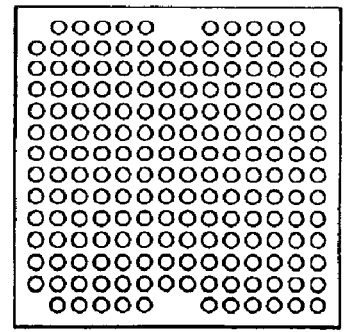

Next, FIG. 7A shows an example of the reference mark position according to a fourth embodiment of the present invention, while FIG. 7B is a view showing another example. FIG. 7A shows an arrangement in which a pair of reference marks 30 are arranged symmetrically about the center point of the inner peripheral portion of the pattern of the BG connecting portions 6 of an octagonal BGA component 5 shown in FIG. 20G. FIG. 7B shows an arrangement in which one reference mark 30 is arranged in a center portion of the pattern of the BG connecting portions 6 arranged irregularly as shown in FIG. 20H or in a center portion of the BGA component 5. As described above, if the positional detection is executed by the reference mark(s) 30 itself without the intervention of the complicated pattern of the BG connecting portions 6, then the confirmation and detection of the desired component position can be achieved. It is to be noted that, when the presence or absence of the BG connecting portions 6 is managed in the form of data as shown in FIG. 5A in the present fourth embodiment, it is convenient to manage the data on the assumption that the electrode P11 is absent in terms of data management.

As described above, the shape of the reference mark 30 may be any one of the circle, rectangle, triangle, cross shape, and the like. With regard to the positions and numbers of the marks, the arbitrary positional detection can be achieved reliably and easily if at least one reference mark exists. This reference mark 30 is preferably formed at a corner portion of the component in order to facilitate the detection of the component angle deviation.

Figure 8A:
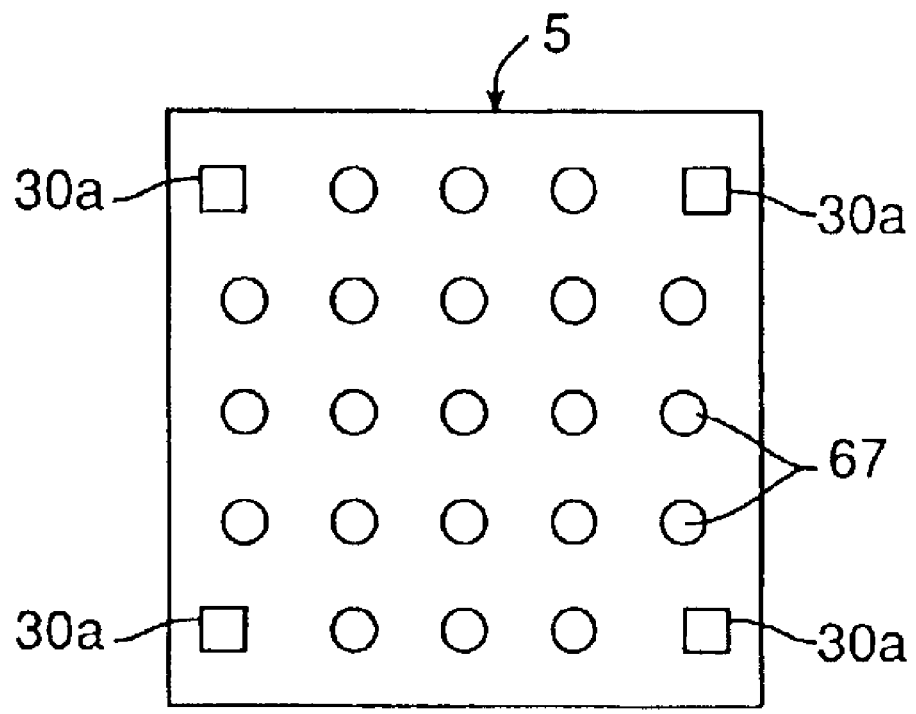
FIG. 8A is a bottom view of a reference mark implemented by a projection provided on an outer peripheral surface of a BG connecting portion pattern of the fourth embodiment.
Figure 8B:
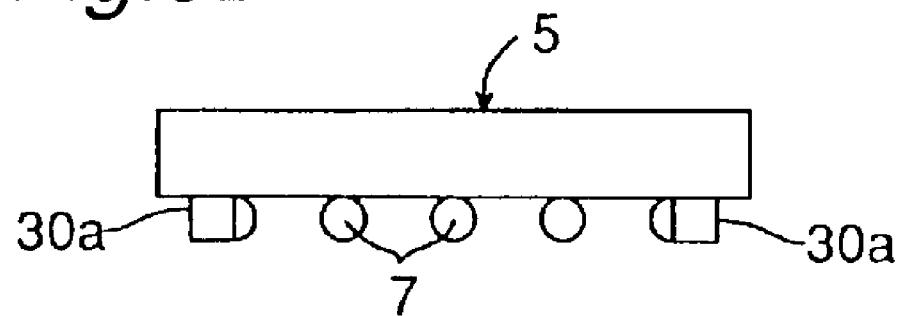
FIG. 8B is a side view of the above.

FIG. 8A is a bottom view of reference marks implemented by a projection (for example, a solder bump height position regulating use spacer) provided in an outer peripheral position of the BG connecting portion pattern of the fourth embodiment, while FIG. 8B is a side view of the above. In FIGS. 8A and 8B, the reference numeral 30a denotes the projection that serves as the reference mark.

Although the reference marks 30 have been described as reference points formed simultaneously with the pattern arrangement of the BG connecting portions 6 in the first embodiment, the reference mark may be a one that assures the relative positional relation with a specified accuracy and may be provided by a projection or a print mark such as a silk print attached to the BGA component 5.

In regard to the other factors, the first embodiment has been described on the basis of the inspection method for obtaining the arrangement of the solder bumps 7 according to the pitches 32a and 33a and the adjacency pitches 32b and 33b. However, with the setting based on the reference marks 30, the setting can also be easily applied to pattern matching for comparing the previously prepared pattern arrangement image of the BG connecting portions 6 with the BG connecting portions 6 of the BGA component 5 or other cases.

Although the above description has been made, of course, on the basis of the ball-shaped solder bumps 7 on the BG connecting portions 6, the same operation and effect as those described above can be obtained regardless of the shape. Besides the above, the method and apparatus can also be applied to bare-chip mounting having solder bumps. The provided reference mark(s) can also be utilized for leaded components such as pin-shaped PGA (Pin Grid Array), J-leaded components (SOJ: Small Outline J-leaded Package), and QFP.

Figure 9:
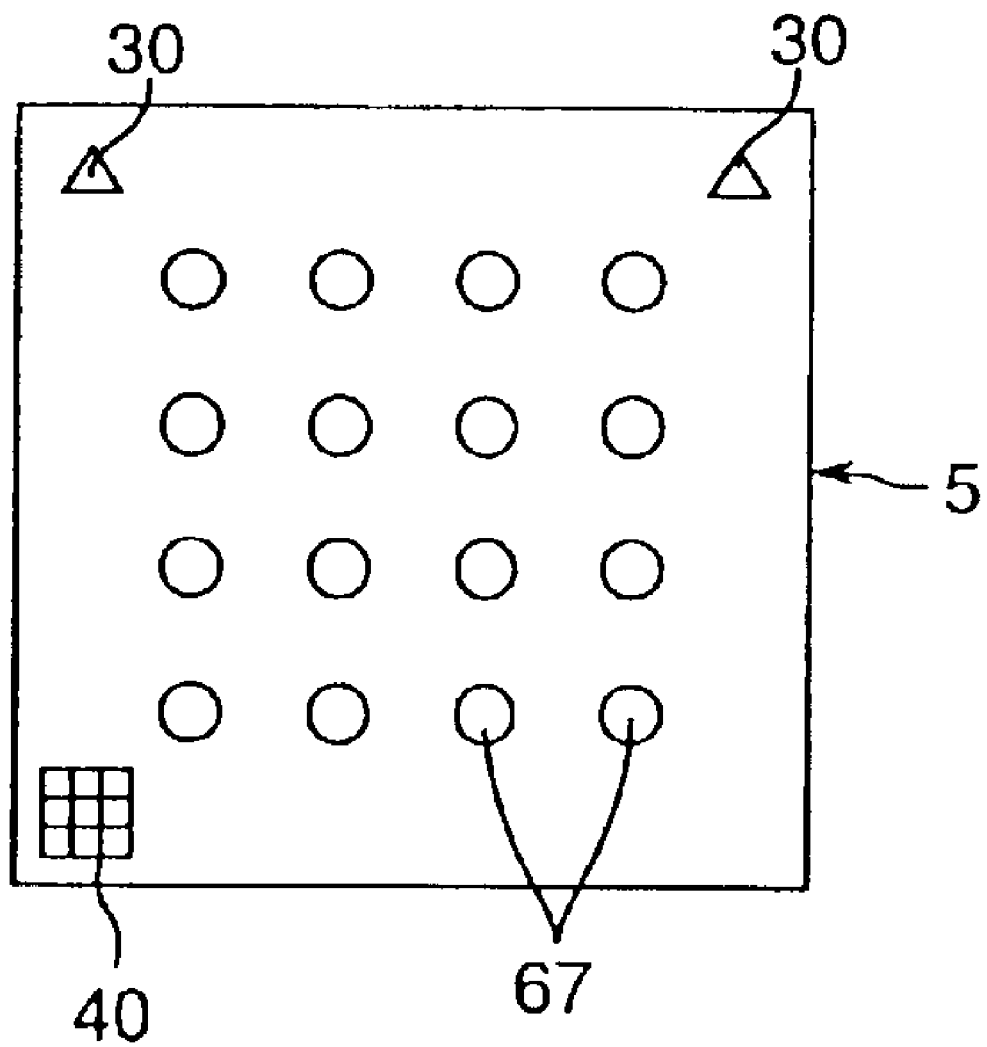
FIG. 9 is a bottom view of a BGA component whose one reference mark is implemented by a two-dimensional bar code according to a fifth embodiment of the present invention.
Figure 10:
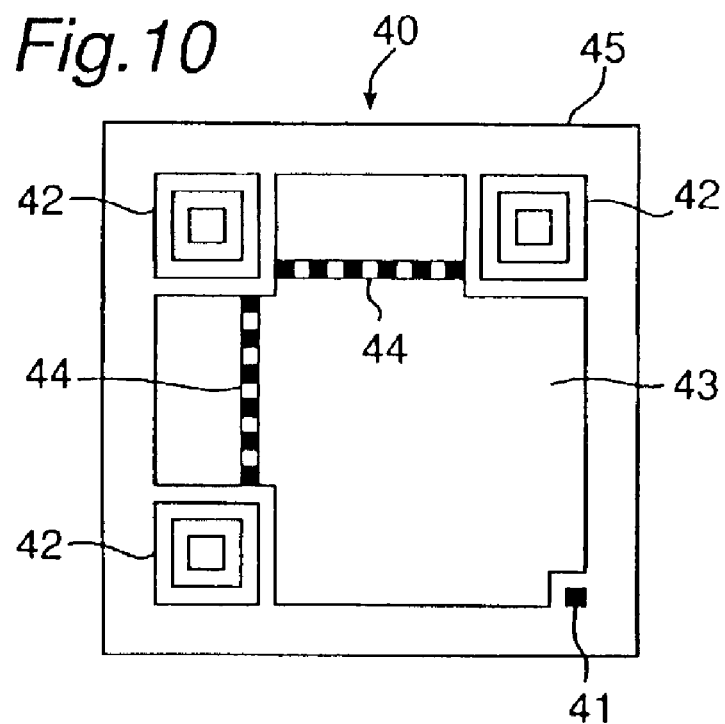
FIG. 10 is an enlarged view showing an example of the two-dimensional bar code obtained by coding information at high density.

Next, FIG. 9 shows a bottom view of a BGA component whose one of the reference marks is implemented by a two-dimensional bar code according to a fifth embodiment of the present invention. In FIG. 9, the reference numeral 40 denotes a two-dimensional bar code. FIG. 10 is an enlarged view showing an example of the two-dimensional bar code obtained by coding information at high density. In FIG. 10, reference numerals denote respectively, 40 the two-dimensional bar code, 41 an original point, 42 detection marks, 43 a data section, 44 timing marks, and 45 a margin.

The fifth embodiment concurrently uses the two-dimensional bar code 40 as one of a plurality of reference marks 30 provided for the BGA component 5. Otherwise, if there is a margin of space on the BGA component 5, the two-dimensional bar code 40 is allowed to have a large size for an enlarged information carrying area capable of having a wide variety of information.

In addition, by coding the land pitch and the positional information of the BG connecting portions 6 of a variety of components and the information for mounting the components as information expressed by the data section 43 of the two-dimensional bar code 40, the mounting control of the mounting head height, the mounting speed, the mounting pressure control, and the like in the mounting stage can be executed for each component on the basis of the information. Furthermore, if the component names and the like are coded as information, then the component type of each individual component can be confirmed by checking whether or not the component is the proper target component to be mounted. This arrangement enables the prevention of faulty component setting and is also able to be utilized for the quality improvement by virtue of the prevention of the faulty mounting and for a reduction in time when replacing the faultily mounted component and performing rearrangement in replenishing the component to be mounted.

Figure 11A:
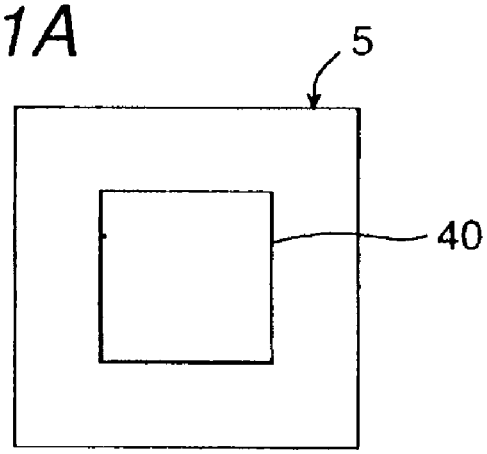
FIG. 11A is a front view of a two-dimensional bar code provided on the surface opposite from the surface that has the BG connecting portions of the BGA component according to a sixth embodiment of the present invention.
Figure 11B:
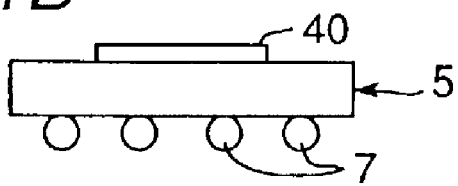
FIG. 11B is a side view of the above.

FIG. 11A is a front view of a two-dimensional bar code provided on the surface opposite from the surface that has BG connecting portions of a BGA component according to a sixth embodiment of the present invention, while FIG. 11B is a side view of the above. The bar code is provided on the surface opposite from the connecting surface described in connection with the fifth embodiment. If the two-dimensional bar code 40 is provided on the upper surface of the BGA component 5 and a variety of information for mounting the components, such as the land pitch and positional information of the BG connecting portions of the various components are coded as the indicated information, then the mounting control of the mounting head height, the mounting speed, the mounting pressure control, and so on in the mounting stage can be executed for each component on the basis of the information as the checking and correcting processes in the component recognizing process (process S4) shown in FIG. 4. Furthermore, a two-dimensional bar code 40 having a larger size can be used by providing the bar code on the surface opposite from the connecting surface, and the information carrying area is enlarged to allow a wider variety of information to be provided. This operates favorably in controlling the mounting. If the amounts of deviation from the permissible range and the dropouts of the solder bumps are stored as information to be stored in the two-dimensional bar code 40 or another storage medium, then the information can be utilized as information for determining whether or not the component should be scrapped or reused with the solder bump reformed when the BGA component 5 is determined to be defective.

Figure 12A:
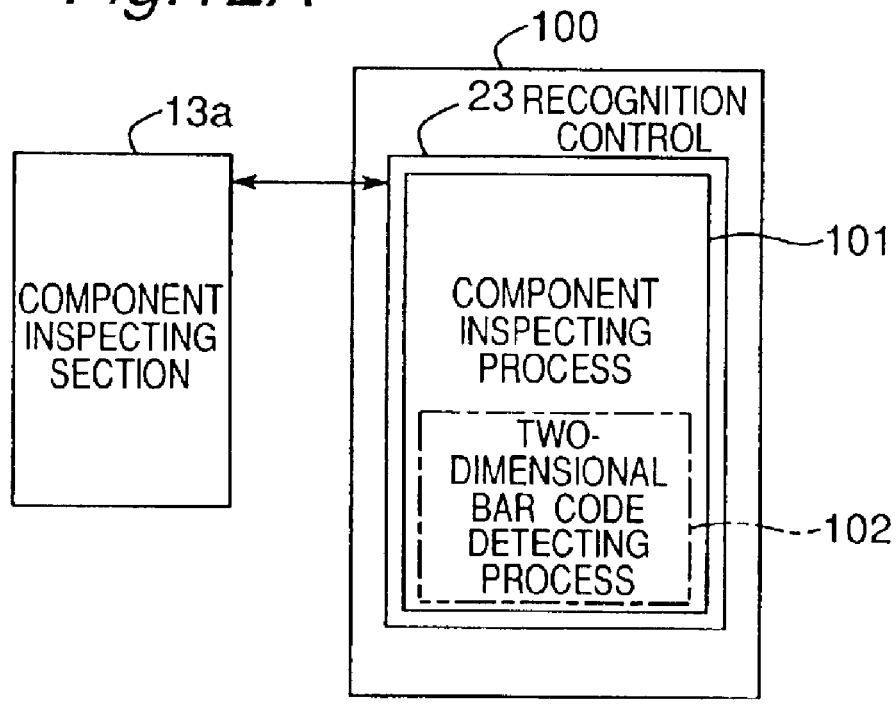
FIG. 12A is a view explaining two-dimensional bar code processing through a component inspection process in the control section of the sixth embodiment.
Figure 12B:
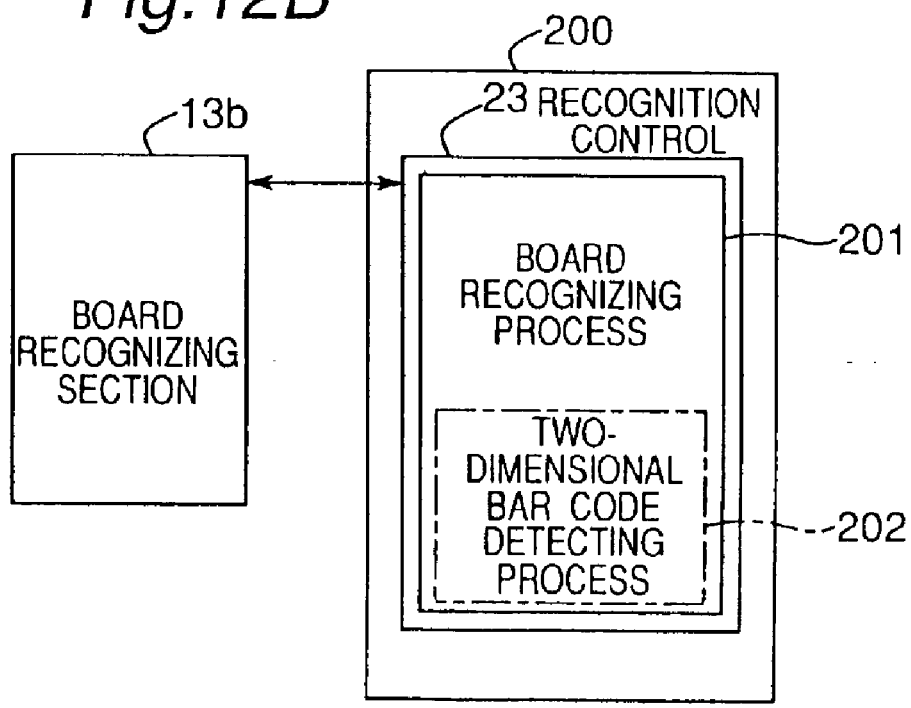
FIG. 12B is a view for explaining the two-dimensional bar code processing through a board recognizing process.

FIG. 12A shows two-dimensional bar code processing through a component inspecting process of a control section, while FIG. 12B is a view for explaining the two-dimensional bar code processing through a board recognizing process. The component inspecting process shown in FIG. 12A obtains the information of the component by two-dimensional bar code detection through the component inspecting process of the recognition control section 23 from a signal read from the component inspecting section 13a, and executes the component recognizing process. Also, in the board recognizing process shown in FIG. 12B, the component information is obtained by detecting the two-dimensional bar code from a signal from the board recognizing section 13b through the board recognizing process in the recognition control section 23. By sharing the two-dimensional bar code detecting process of the board recognizing section 13b and further sharing an optical detector of, for example, a camera or a laser scanner as the component recognizing section 13b for recognizing the reference mark 30 so as to read the two-dimensional bar code 40, the detection of the component inspecting section 13a becomes unnecessary.

If the component name is coded as information, the control section can confirm whether or not the component is the normal target component to be mounted in the component take-out process (process S3) and the component recognizing process (process S4) of the flowchart shown in FIG. 4 by the mounting program 20a or through a component checking process based on the component data 20b, thereby allowing the component type of each individual component to be confirmed.

With this arrangement, the control section can also be used as an automating apparatus for preventing the faulty component setting. Furthermore, there is produced the effect of improving the quality by virtue of the prevention of the faulty mounting, and reducing the time for replacing the faultily mounted component and performing rearrangement in replenishing the component to be mounted.

Figure 15:
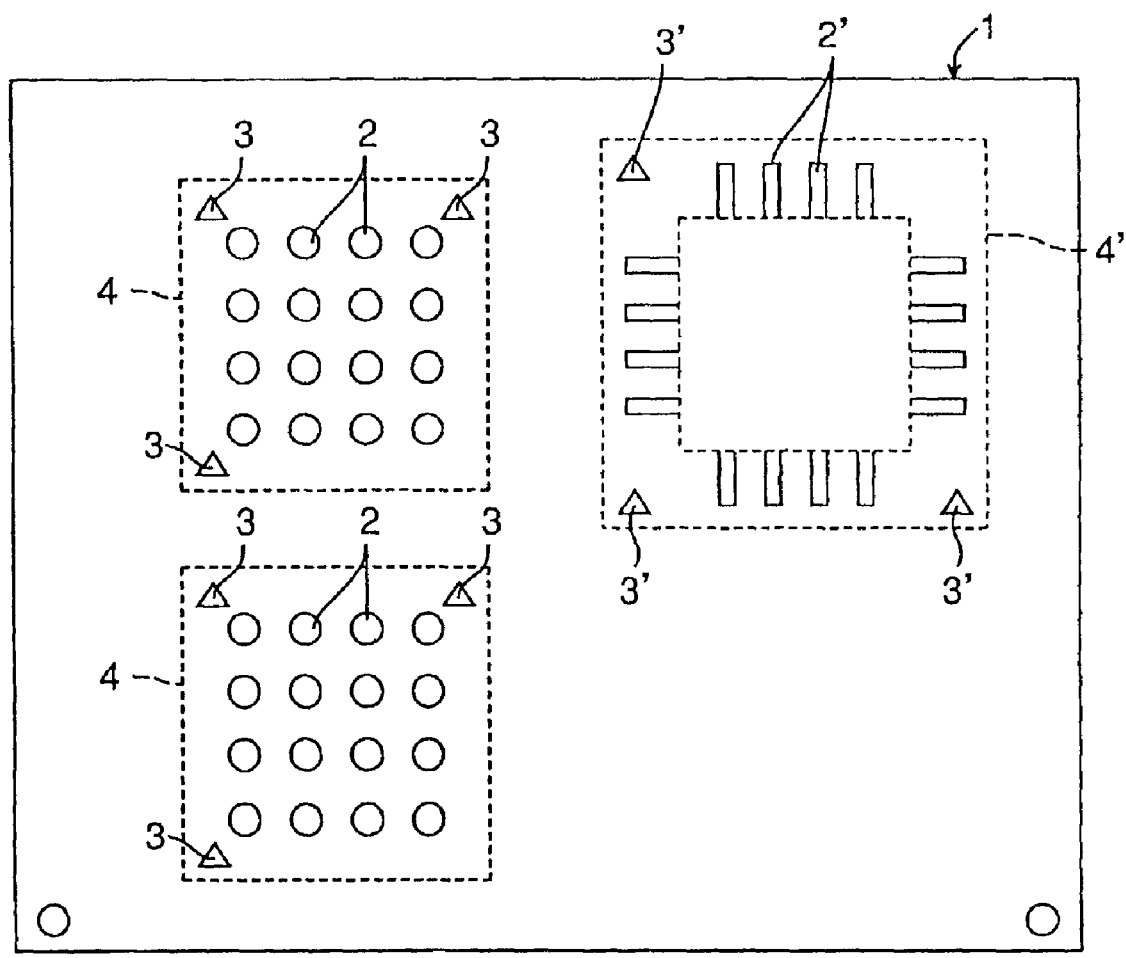
FIG. 15 is a front view showing the outline of the land patterns of a QFP and BGA components having solder bumps on a conventional printed board.

Next, according to a seventh embodiment of the present invention, the two-dimensional bar code 40 that simultaneously serves as recognition marks 3, 3' is provided as one of a plurality of recognition marks 3, 3' owned by mounting land patterns 4, 4' on the printed board 1 as shown in FIG. 15. With this arrangement, according to the mounting process of the flowchart shown in FIG. 4, the component mounting process (process S8) is executed, and the program flow proceeds in the process S9 to the next mounting position to recognize the recognition marks 3 and the two-dimensional bar code 40 on the printed board 1 by the board recognizing section 13b in the board mounting position recognizing process (process S6). In this stage, the two-dimensional bar code 40 is provided with component information (for example, the component PAAAA, mounting head speed 1; . . . ) needed for the mounting. After determining the necessary component by the aforementioned component information in the next determination (check) correcting process (process S7), the component (PAAAA, for example) designated by, for example, the read two-dimensional bar code 40 is fetched from the component supplying section 16 in the component take-out process (process S3). Subsequently, by repeating the component mounting through the same processes, the faulty component mounting can be eliminated.

Next, according to an eighth embodiment of the present invention, the present invention can be applied to a three dimensional mounting of components.

Figure 21:
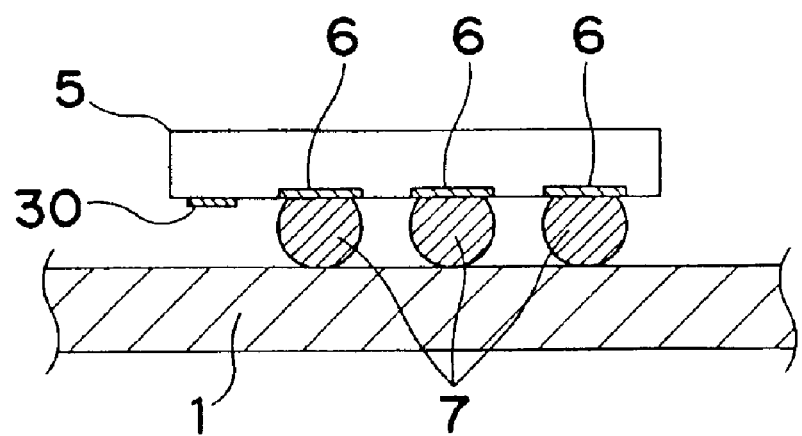
FIGS. 21 and 22 are explanatory views showing an issue during three dimensional mounting.
Figure 22:
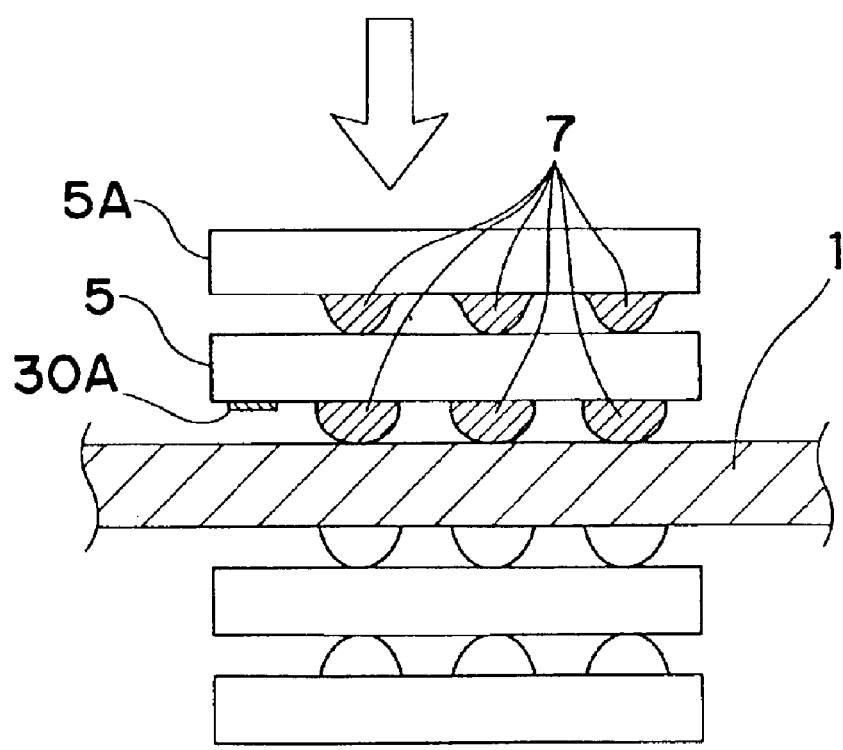

As shown in FIG. 21, after a reference mark 30(s) is formed on a lower surface of a BGA component 5 and such a component 5 is mounted on a circuit board 1, the reference mark 30 can not be recognized. Therefore, when another BGA component 5A is mounted on an upper surface of the component 5 mounted on the board 1 for three dimensional mounting as shown in FIG. 22, it is difficult to adjust the positions of the another component 5A and the mounted component 5 to each other.

Figure 23:
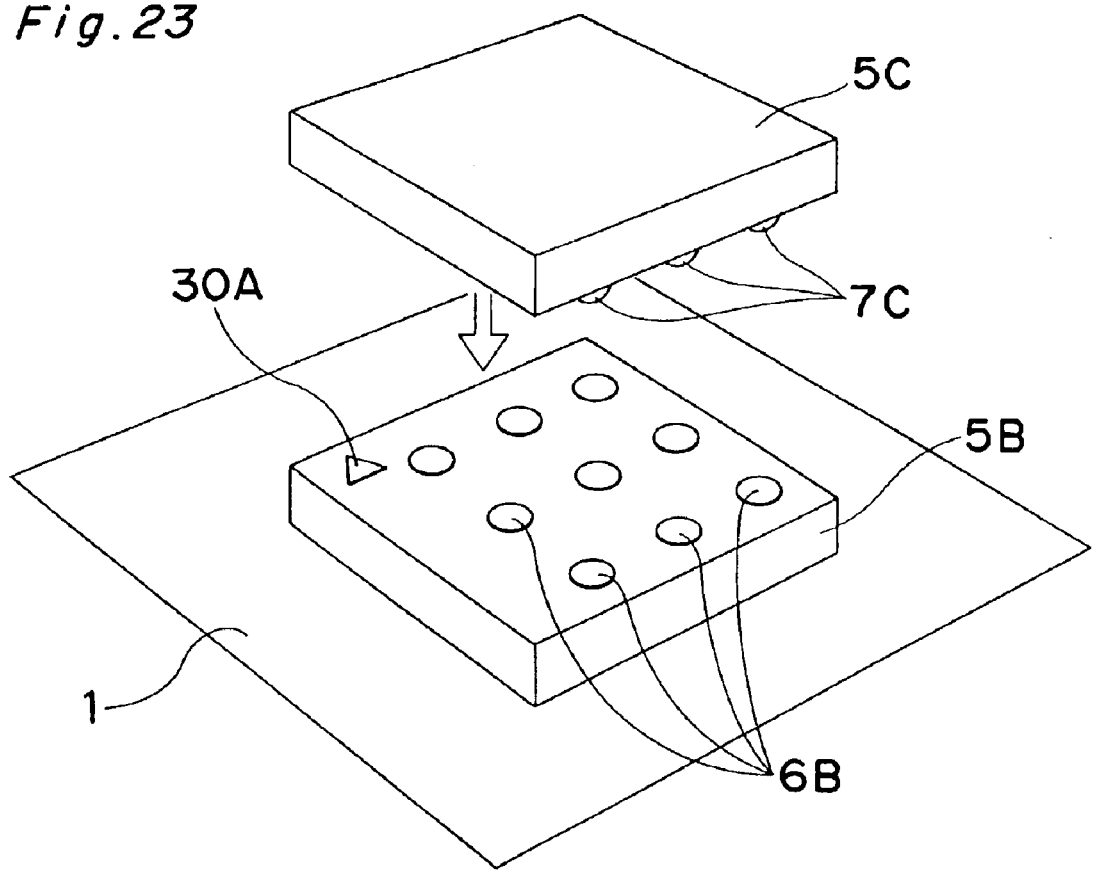
FIGS. 23 and 24 are explanatory views showing three dimensional mounting according an eighth embodiment of the present invention.
Figure 24:
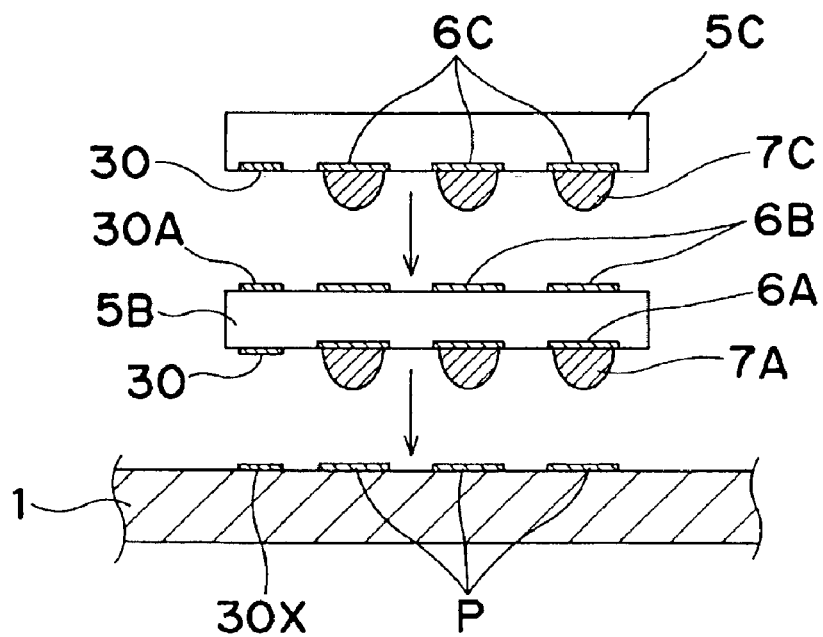

In this eighth embodiment, as shown in FIGS. 23 and 24, a first BGA component 5B has, at its lower surface, many BG connecting portions (lands) 6A and solder bumps 7A thereon. The first BGA component 5B has a reference mark(s) 30 formed on its lower surface. The positions of the electrical connecting portions 6A of the first electronic component 5B are defined based on the reference mark 30 on the first electronic component 5B. The first BGA component 5B also has many electrodes 6B at the upper surface for connecting to second BGA component 5C and a reference mark(s) 30 formed on the upper surface thereof. The positions of the electrical connecting portions 6B of the first electronic component 5B are defined based on the reference mark 30A on the first electronic component 5B.

A second BGA component 5C has, at its lower surface, many BG connecting portions (lands) 6C and solder bumps 7C thereon. The second BGA component 5C has a reference mark(s) 30 formed on its lower surface. The positions of the electrical connecting portions 6C of the second electronic component 5C are defined based on the reference mark 30 on the second electronic component 5C.

The positions of the electrical connecting portions P of the printed circuit board 1 are defined based on the reference mark 30X on the printed circuit board 1.

An electronic component mounting method according to the eighth embodiment is carried out as follows.

Firstly, the reference mark 30X on the printed circuit board 1 and the reference mark 30 on the first electronic component 5B are recognized by a camera to find a shift between positions of the first electronic component 5B and the board 1.

Then, the shift between the positions of the first electronic component 5B and the board 1 are corrected, if necessary, through the adjustment of the position of the first electronic component 5B with respect to the board 1 as one example.

Then, the first electronic component 5B is mounted onto the board 1 so that the solder bumps 7A formed on the BG connecting portions (lands) 6A of the first BGA component 5B are electrically connected to the electrodes P of the board 1.

Then, the reference mark 30 on the second electronic component 5C and the reference mark 30A on the first electronic component 5B are recognized by the camera to find a shift between positions of the first electronic component 5B and the second electronic component 5C.

Then, the shift between the positions of the first electronic component 5B and the second electronic component 5C are corrected, if necessary, through the adjustment of the position of the second electronic component 5C with respect to the first electronic component 5B as one example.

Then, the first electronic component 5B is mounted onto the second electronic component 5C so that the solder bumps 7C formed on the BG connecting portions (lands) 6C of the second BGA component 5C are electrically connected to the electrodes 6B of the component 5B mounted on the board 1.

Therefore, it is easy to correct the positions of the board 1, the first BGA component 5B, and the second BGA component 5C to each other, resulting in accomplishing three dimensional mounting with higher accuracy.

Figure 25:
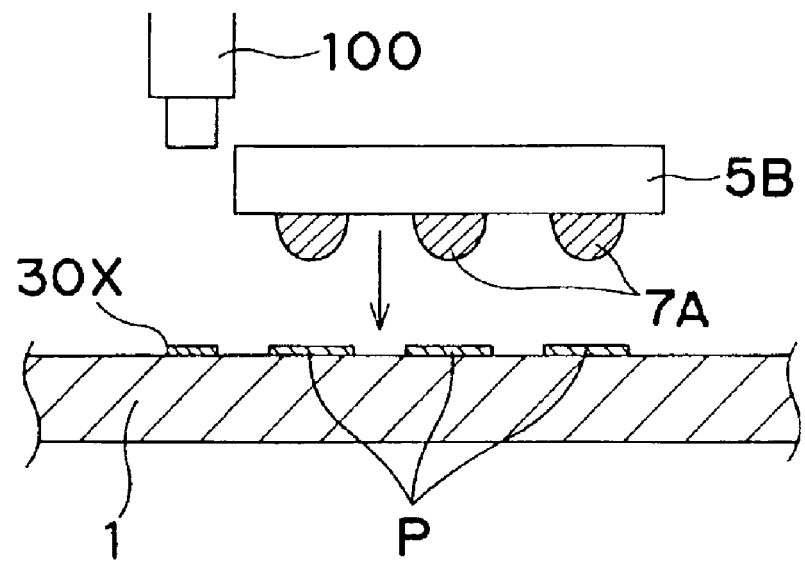
FIGS. 25 and 26 are explanatory views showing the three dimensional mounting according the eighth embodiment of the present invention.
Figure 26:
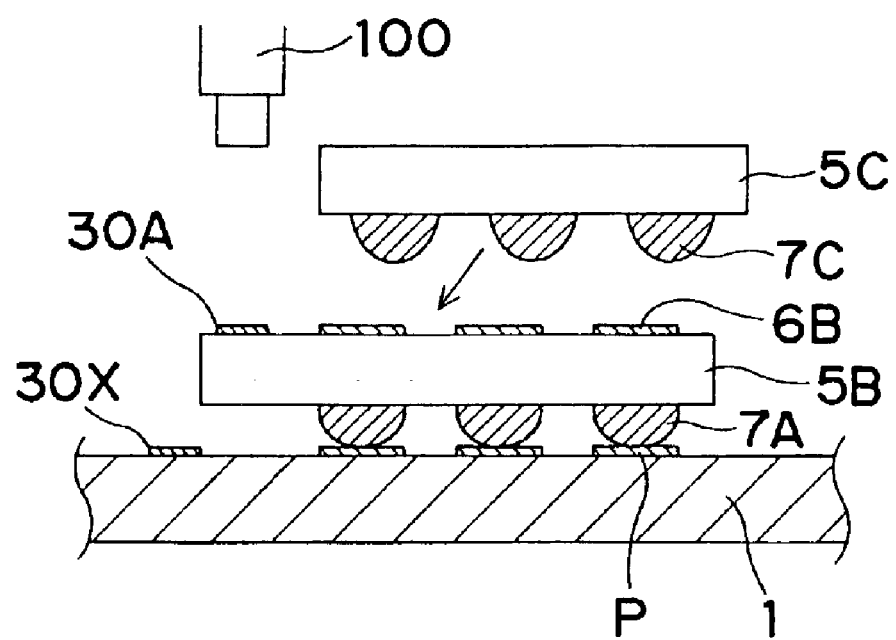

In addition, as shown in FIGS. 25 and 26, when the three dimensional mounting is carried out, a camera 100 which focal length can be changed can be used to change the focal lengths of the camera 100 when a reference mark 30X of the board 1 and the reference mark 30A of the first BGA component 5B are recognized by the camera 100. That is, firstly, the reference mark 30X on the board 1 is recognized by the camera 100 as shown in FIG. 25, a correction is made based on a shift between the first BGA component 5B and the board 1 if necessary. Then, the first BGA component 5B is mounted on the board 1. Thereafter, the focal length of the camera 100 is changed so as to make its focal length shorter without changing the height of the camera 100 to the mounting surface of the board 1, and the reference mark 30A on the upper surface of the first BGA component 5B is recognized by the camera 100 as shown in FIG. 26. Then, a correction is made based on a shift between the first BGA component 5B and the second BGA component 5C if necessary. Then, the second BGA component 5C is mounted on the board 1.

Therefore, even though the heights of the reference marks 30X and 30A are different from each other with respect to the mounting surface of the board 1, both of the marks 30X and 30A can be recognized by a single camera 100.

In this eighth embodiment, each of the BGA components 5B, 5C is a bare IC chip such as an electronic component having electrical connecting portions such as solder bumps or electrodes (lands, for example) exemplified by a solder bump component of a BGA (Ball Grid Array) type semiconductor component package (referred to as a BGA component hereinafter) represented by a CSP (Chip Size Package) or an electronic component such as QFP in forming an electronic circuit and relates to the mounting method and apparatus thereof.

In addition, after the height of the reference mark 30A is detected, a load applied to the second electronic component 5C can be changed based on the height of the reference mark 30A.

The aforementioned embodiments have been described on the basis of the example of the mounting apparatus mounted with the mounting head 13 that takes out the electronic component from the component supply section, moves the component to the mounting table 14 and executes the mounting position determining driving. However, by applying the solder bump component mounting method of the present invention, simple and reliable mounting of a wide range of application and the quality can be assured as compared with the conventional cases. There may be another mounting apparatus as shown in FIG. 15, mounted with a sliding component supply section and an X-Y table for holding the printed board and executing positioning on the mounting table. The present invention can also be applied to a mounting apparatus with a robot or an assembling process with component supply of a similar configuration, and they can be implemented with the same effect.

As described above, the present invention enables the arrangement of the complicated connection portion pattern, positional detection, and quality check (good-or-bad decision) that have been unable to be inspected or detected, by virtue of the reference mark(s) of the solder bump component to be mounted and allows the improvement of the quality in mounting the circuit board with electronic components by the assurance of component quality immediately before the mounting.

Furthermore, according to the present invention, the state of arrangement of the whole BG connecting portions can be detected in position and checked easily and accurately at high speed by the reference mark(s) provided on the connecting surface side of the solder bump component, so that a reliable component mounting quality can be provided.

Furthermore, according to the present invention, the reference mark(s) provided on the surface opposite from the connecting surface side has reliable relative positional relations with the connecting portions, and therefore, the positional detection in the component mounting stage can be confirmed in appearance by the reference mark(s) before or after the mounting.

Furthermore, the present invention enables the arrangement, positional detection, and quality check of the complicated connection portion pattern by virtue of the reference mark(s) constructed of a projection peculiar to the electronic component or a print, and allows the improvement of the quality in mounting the circuit board with electronic components.

Furthermore, according to the present invention, if at least one of the reference marks a reference mark obtained by coding information, then the precise mounting information can be obtained for each component according to the coded information.

Furthermore, according to the present invention, the component type of each individual component can be confirmed by the discrimination information expressed by the two-dimensional bar code, and the information can be utilized for the automatization for preventing the faulty component setting. This is effective for the quality improvement by virtue of the prevention of the faulty mounting, and for a reduction in time when replacing the component and performing rearrangement in replenishing the component to be mounted.

Furthermore, the present invention is to mount the solder bump component having a reference mark(s). The electronic component to be mounted is subjected to the positional detection and the quality check by recognizing the reference mark(s) in the recognition process, so that the positional correction in the mounting stage is executed. This can reduce the mounting cycle time and improve the productivity as compared with the conventional component position detection, so that the component mounting can be achieved faster and more reliably to allow the quality to be improved.

Furthermore, the present invention can achieve the component mounting faster and more reliably by confirming the recognition mark(s) on the printed board in the recognizing process.

Furthermore, according to the present invention, the state of arrangement of the whole BG connecting portions, the shape of each solder bump, the dropout of the solder bump that causes the defective component mounting, and so on can be detected and checked easily and accurately at high speed by the reference mark(s), so that a reliable component mounting quality can be provided.

Furthermore, according to the present invention, the information of the coded reference mark(s) can assure an inexpensive and simple structure, without the necessity of providing a separate special device for executing detection, by virtue of the detection that is achieved and is also used for the recognition process.

Furthermore, according to the present invention, the component type in the electronic component mounting position can be confirmed to prevent the faulty mounting by virtue of the fact that at least one of the recognition marks on the printed board is the discrimination information expressed by the two-dimensional bar code obtained by coding information.

Furthermore, the component mounting apparatus of the present invention can assure the mounting quality and allows the continuous and effective printed board mounting to be implemented and provided in mounting the electronic component by the aforementioned component mounting method.

Furthermore, the present invention can mount components continuously and effectively and allows the automatization and productivity to be improved by continuously supplying the electronic components by the component supply section.

As described above, there are produced the effects of improving the quality and yield productivity in mounting the electronic components such as the solder bump components and the like and enabling the achievement of inexpensive and effective electronic equipment production.

The entire disclosure of Japanese Patent Application No. 8-333782 filed on Dec. 13, 1996, including specification, claims, drawings, and summary are incorporated herein by reference in its entirety.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. An electronic component mounting method comprising:

recognizing a first reference mark on a printed circuit board having thereon at least one first electrical connecting portion, with a position of said at least one first electrical connecting portion being defined based on said first reference mark, and with said first reference mark and said at least one first electrical connecting portion being simultaneously formed on said printed circuit board via a mask;

recognizing a second reference mark on a first electronic component having thereon at least one second electrical connecting portion, with a position of said at least one second electrical connecting portion being defined based on said second reference mark, and with said second reference mark and said at least one second electrical connecting portion being simultaneously formed on said first electronic component via a mask;

determining a shift between a position of said printed circuit board and a position of said first electronic component based on the recognition of said first and second reference marks;

correcting the shift between the position of said printed circuit board and the position of said first electronic component, and mounting said first electronic component to said printed circuit board;

recognizing a third reference mark on a second electronic component having thereon at least one third electrical connecting portion, with a position of said at least one third electrical connecting portion being defined based on said third reference mark, and with said third reference mark and said at least one third electrical connecting portion being simultaneously formed on said second electronic component via a mask;

recognizing a fourth reference mark on said first electronic component, wherein said first electronic component also has thereon at least one fourth electrical connecting portion, with a position of said at least one fourth electrical connecting portion being defined based on said fourth reference mark, and with said fourth reference mark and said at least one fourth electrical connecting portion being simultaneously formed on said first electronic component via a mask;

determining a shift between a position of said second electronic component and a position of said first electronic component based on the recognition of said third and fourth reference marks; and correcting the shift between the position of said second electronic component and the position of said first electronic component, and mounting said second electronic component to said first electronic component.

2. The electronic component mounting method according to claim 1, wherein
said first reference mark and said at least one first electrical connecting portion are formed on one surface of said printed circuit board,
said second reference mark and said at least one second electrical connecting portion are formed on one surface of said first electronic component,
said third reference mark and said at least one third electrical connecting portion are formed on one surface of said second electronic component, and
said fourth reference mark and said at least one fourth electrical connecting portion are formed on another surface of said first electronic component.

3. The electronic component mounting method according to claim 2, wherein
said one surface of said printed circuit board is an upper surface of said printed circuit board,
said one surface of said first electronic component is a lower surface of said first electronic component,
said another surface of said first electronic component is an upper surface of said first electronic component, and
said one surface of said second electronic component is a lower surface of said second electronic component.

4. The electronic component mounting method according to claim 3, wherein
said at least one first electrical connecting portion comprises plural first electrical connecting portions,
said at least one second electrical connecting portion comprises plural second electrical connecting portions,
said at least one third electrical connecting portion comprises plural third electrical connecting portions, and
said at least one fourth electrical connecting portion comprises plural fourth electrical connecting portions.

5. The electronic component mounting method according to claim 4, wherein
recognizing said first reference mark on said printed circuit board comprises using a first focal length of a camera to recognize said first reference mark, and
recognizing said second reference mark on said first electronic component comprises using a second focal length of said camera to recognize said second reference mark,
with said first focal length being greater than said second focal length.

6. The electronic component mounting method according to claim 5, further comprising:
after using said first focal length of said camera to recognize said first reference mark, changing the focal length of said camera to said second focal length without changing a distance from said camera to said printed circuit board, which second focal length is then used to recognize said second reference mark.

7. The electronic component mounting method according to claim 6, wherein
mounting said first electronic component to said printed circuit board comprises mounting said plural first electrical connecting portions to said plural second electrical connecting portions, and
mounting said second electronic component to said first electronic component comprises mounting said plural third electrical connecting portions to said plural fourth electrical connecting portions.

8. The electronic component mounting method according to claim 2, wherein
recognizing said first reference mark on said printed circuit board comprises using a first focal length of a camera to recognize said first reference mark, and
recognizing said second reference mark on said first electronic component comprises using a second focal length of said camera to recognize said second reference mark,
with said first focal length being greater than said second focal length.

9. The electronic component mounting method according to claim 1, wherein
said at least one first electrical connecting portion comprises plural first electrical connecting portions,
said at least one second electrical connecting portion comprises plural second electrical connecting portions,
said at least one third electrical connecting portion comprises plural third electrical connecting portions, and
said at least one fourth electrical connecting portion comprises plural fourth electrical connecting portions.

10. The electronic component mounting method according to claim 9, wherein
recognizing said first reference mark on said printed circuit board comprises using a first focal length of a camera to recognize said first reference mark, and
recognizing said second reference mark on said first electronic component comprises using a second focal length of said camera to recognize said second reference mark,
with said first focal length being greater than said second focal length.

11. The electronic component mounting method according to claim 10, further comprising:

after using said first focal length of said camera to recognize said first reference mark, changing the focal length of said camera to said second focal length without changing a distance from said camera to said printed circuit hoard, which second focal length is then used to recognize said second reference mark.

12. The electronic component mounting method according to claim 9, wherein said first reference mark and said plural first electrical connecting portions are formed on one surface of said printed circuit board, said second reference mark and said plural second electrical connecting portions are formed on one surface of said first electronic component, said third reference mark and said plural third electrical connecting portions are formed on one surface of said second electronic component, and said fourth reference mark and said plural fourth electrical connecting portions are formed on another surface of said first electronic component.

13. The electronic component mounting method according to claim 1, wherein mounting said first electronic component to said printed circuit board comprises mounting said at least one first electrical connecting portion to said at least one second electrical connecting portion, and mounting said second electronic component to said first electronic component comprises mounting said at least one third electrical connecting portion to said at least one fourth electrical connecting portion.

14. The electronic component mounting method according to claim 13, wherein said at least one first electrical connecting portion comprises plural first electrical connecting portions, said at least one second electrical connecting portion comprises plural second electrical connecting portions, said at least one third electrical connecting portion comprises plural third electrical connecting portions, and said at least one fourth electrical connecting portion comprises plural fourth electrical connecting portions.

15. The electronic component mounting method according to claim 13, wherein recognizing said first reference mark on said printed circuit board comprises using a first focal length of a camera to recognize said first reference mark, and recognizing said second reference mark on said first electronic component comprises using a second focal length of said camera to recognize said second reference mark, with said first focal length being greater than said second focal length.

16. The electronic component mounting method according to claim 15, further comprising:

after using said first focal length of said camera to recognize said first reference mark, changing the focal length of said camera to said second focal length without changing a distance from said camera to said printed circuit board, which second focal length is then used to recognize said second reference mark.

17. The electronic component mounting method according to claim 13, wherein said first reference mark and said at least one first electrical connecting portion are formed on one surface of said printed circuit board, said second reference mark and said at least one second electrical connecting portion are formed on one surface of said first electronic component, said third reference mark and said at least one third electrical connecting portion are formed on one surface of said second electronic component, and said fourth reference mark and said at least one fourth electrical connecting portion are formed on another surface of said first electronic component.

18. The electronic component mounting method according to claim 17, wherein said one surface of said printed circuit board is an upper surface of said printed circuit board, said one surface of said first electronic component is a lower surface of said first electronic component, said another surface of said first electronic component is an upper surface of said first electronic component, and said one surface of said second electronic component is a lower surface of said second electronic component.

19. The electronic component mounting method according to claim 1, wherein recognizing said first reference mark on said printed circuit board comprises using a first focal length of a camera to recognize said first reference mark, and recognizing said second reference mark on said first electronic component comprises using a second focal length of said camera to recognize said second reference mark, with said first focal length being greater than said second focal length.

20. The electronic component mounting method according to claim 19, further comprising:

after using said first focal length of said camera to recognize said first reference mark, changing the focal length of said camera to said second focal length without changing a distance from said camera to said printed circuit board, which second focal length is then used to recognize said second reference mark.

* * * * *

UNITED STATES PATENT AND TRADEMARK OFFICE
CERTIFICATE OF CORRECTION

PATENT NO. : 6,938,335 B2
APPLICATION NO. : 10/153673
DATED : September 6, 2005
INVENTOR(S) : Takeshi Kuribayashi et al.

It is certified that error appears in the above-identified patent and that said Letters Patent is hereby corrected as shown below:

ON THE TITLE PAGE:

In Item (63) Related U.S. Application Data:

Please change "Continuation-in-part of application No. 09/319,779, filed on Jun. 11, 1999, now Pat. No. 6,429,387." to --Continuation-in-part of U.S. Application No. 09/319,779, which was the National Stage of International Application No. PCT/JP97/04578, filed December 12, 1997, and now U.S. Pat. No. 6,429,387.--.

In Item (56) References Cited:

Please change "4,731,923 A 3/1998 Yagi et al. ... 29/833" to --4,731,923 A 2/1998 Yagi et al. ... 29/833--.

IN THE SPECIFICATION:

In column 1, line 4 through column 1, line 6 "This application is a Continuation-in-Part of application Ser. No. 09/319,779, filed Jun. 11, 1999 now U.S. Pat. No. 6,429,387." should read --This application is a Continuation-in-Part of application Ser. No. 09/319,779, which was the National Stage of International Application No. PCT/JP97/04578, filed December 12, 1997, and now U.S. Pat. No. 6,429,387.--.

Signed and Sealed this

Twenty-sixth Day of December, 2006

JON W. DUDAS
*Director of the United States Patent and Trademark Office*